United States Patent
Lee et al.

(10) Patent No.: US 11,930,661 B2
(45) Date of Patent: Mar. 12, 2024

(54) DISPLAY APPARATUS HAVING ENCAPSULATING LAYERS TERMINATING AT A PERIPHERAL AREA OF A SUBSTRATE AND METHOD OF MANUFACTURING THE SAME

(71) Applicant: Samsung Display Co., Ltd., Yongin-si (KR)

(72) Inventors: Seongryong Lee, Yongin-si (KR); Sangwon Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 47 days.

(21) Appl. No.: 17/174,203

(22) Filed: Feb. 11, 2021

(65) Prior Publication Data

US 2021/0167330 A1     Jun. 3, 2021

Related U.S. Application Data

(63) Continuation of application No. 16/436,833, filed on Jun. 10, 2019, now Pat. No. 10,923,682, which is a
(Continued)

(30) Foreign Application Priority Data

Aug. 29, 2014   (KR) .................. 10-2014-0114517

(51) Int. Cl.
*H10K 50/844*     (2023.01)
*H10K 50/858*     (2023.01)
(Continued)

(52) U.S. Cl.
CPC ....... *H10K 50/8445* (2023.02); *H10K 50/844* (2023.02); *H10K 50/858* (2023.02);
(Continued)

(58) Field of Classification Search
None
See application file for complete search history.

(56) References Cited

U.S. PATENT DOCUMENTS

| | | |
|---|---|---|
| 2002/0140347 A1 | 10/2002 | Weaver |
| 2003/0164674 A1* | 9/2003 | Imamura ............ H05B 33/04 |
| | | 313/493 |

(Continued)

FOREIGN PATENT DOCUMENTS

| | | |
|---|---|---|
| CN | 1533682 A | 9/2004 |
| CN | 101026228 A | 8/2007 |

(Continued)

OTHER PUBLICATIONS

EPO Search Report dated Jan. 28, 2016, corresponding to European Patent application 15182808.4, (10 pages.

(Continued)

*Primary Examiner* — Nduka E Ojeh
(74) *Attorney, Agent, or Firm* — Lewis Roca Rothgerber Christie LLP

(57) ABSTRACT

A display apparatus includes a substrate on which a central area having a display area and a peripheral area disposed around the central area are defined. The display apparatus includes a display area inorganic layer on the display area and extending to a portion of the peripheral area; and an encapsulation inorganic layer covering the display area, on the display area inorganic layer, and having an edge that is in parallel with or extending over an edge of the display area inorganic layer.

11 Claims, 16 Drawing Sheets

Related U.S. Application Data continuation of application No. 14/727,670, filed on Jun. 1, 2015, now Pat. No. 10,319,944.

(51) Int. Cl.
*H10K 59/12* (2023.01)
*H10K 59/123* (2023.01)
*H10K 59/124* (2023.01)
*H10K 71/00* (2023.01)
*H10K 102/00* (2023.01)

(52) U.S. Cl.
CPC .......... *H10K 59/12* (2023.02); *H10K 59/123* (2023.02); *H10K 59/124* (2023.02); *H10K 71/00* (2023.02); *H10K 59/1201* (2023.02); *H10K 2102/311* (2023.02)

(56) References Cited

U.S. PATENT DOCUMENTS

| | | | |
|---|---|---|---|
| 2004/0185301 A1 | 9/2004 | Tsuchiya et al. | |
| 2007/0194711 A1 | 8/2007 | Matsuura et al. | |
| 2008/0079360 A1* | 4/2008 | Kubota | H10K 50/844 |
| | | | 313/505 |
| 2008/0309226 A1 | 12/2008 | Kim et al. | |
| 2009/0267487 A1 | 10/2009 | Kwack et al. | |
| 2011/0001146 A1 | 1/2011 | Yamazaki et al. | |
| 2011/0052836 A1 | 3/2011 | Kim et al. | |
| 2011/0139747 A1 | 6/2011 | Lee | |
| 2011/0140163 A1 | 6/2011 | Oh et al. | |
| 2011/0223697 A1 | 9/2011 | Yong-Hwan et al. | |
| 2011/0291116 A1 | 12/2011 | Kang et al. | |
| 2012/0007107 A1 | 1/2012 | Choi | |
| 2012/0091477 A1 | 4/2012 | Kim | |
| 2012/0133275 A1 | 5/2012 | Lee et al. | |
| 2012/0146492 A1 | 6/2012 | Ryu et al. | |
| 2012/0313516 A1 | 12/2012 | Kim et al. | |
| 2014/0070187 A1 | 3/2014 | Cho et al. | |
| 2014/0132148 A1 | 5/2014 | Jang et al. | |
| 2014/0138634 A1 | 5/2014 | Lee et al. | |
| 2014/0138641 A1 | 5/2014 | Yi | |
| 2014/0138645 A1 | 5/2014 | Ryu | |
| 2014/0145155 A1 | 5/2014 | Park | |
| 2014/0175397 A1 | 6/2014 | Lee | |
| 2014/0225075 A1 | 8/2014 | Zhan | |

FOREIGN PATENT DOCUMENTS

| | | |
|---|---|---|
| CN | 101160001 A | 4/2008 |
| CN | 101882668 A | 11/2010 |
| CN | 103824871 A | 5/2014 |
| JP | 2006-351307 A | 12/2006 |
| JP | 2008-165251 A | 7/2008 |
| JP | 2013-131339 A | 7/2013 |
| KR | 10-2011-0065854 A | 6/2011 |
| KR | 10-2011-0101774 A | 9/2011 |
| KR | 10-2012-0040480 | 4/2012 |
| KR | 10-2012-0046427 A | 5/2012 |
| KR | 10-2012-0137055 A | 12/2012 |
| KR | 10-2014-0062376 | 5/2014 |
| KR | 10-2014-0064136 | 5/2014 |
| KR | 10-2014-0069710 | 6/2014 |
| KR | 10-2014-0080246 | 6/2014 |

OTHER PUBLICATIONS

KIPO Office action dated Feb. 1, 2016, for Korean priority Patent application 10-2014-0114517, (7 pages).

U.S. Final Office Action dated Dec. 10, 2019, issued in U.S. Appl. No. 16/436,821 (20 pages).

\* cited by examiner

DISPLAY APPARATUS HAVING ENCAPSULATING LAYERS TERMINATING AT A PERIPHERAL AREA OF A SUBSTRATE AND METHOD OF MANUFACTURING THE SAME

CROSS-REFERENCE TO RELATED APPLICATIONS

This application is a continuation of U.S. patent application Ser. No. 16/436,833, filed Jun. 10, 2019, which is a continuation of U.S. patent application Ser. No. 14/727,670, filed Jun. 1, 2015, now U.S. Pat. No. 10,319,944, which claims priority to and the benefit of Korean Patent Application No. 10-2014-0114517, filed on Aug. 29, 2014, in the Korean Intellectual Property Office, the entire content of all of which is incorporated herein by reference.

BACKGROUND

1. Field

One or more embodiments of the present invention relate to a display apparatus and a method of manufacturing the same.

2. Description of the Related Art

Recently, display apparatuses are variously used. Also, as the display apparatuses have become small in thickness and light weight, a usage range of the display apparatuses has extended.

In particular, display apparatuses have been replaced with portable thin flat panel display apparatuses.

A display apparatus may have a display area on a substrate so as to generate visible rays toward a user, and a display device that emits light may be formed in the display area.

In order to protect the display device from foreign substances, an encapsulation layer or an encapsulation member is formed on the display device.

However, when the durability of the encapsulation member is reduced and thus the encapsulation member does not properly protect the display device, the improvement in durability and image quality of the display apparatus is limited.

In particular, when the encapsulation member does not stably cover the display device but is delaminated or damaged, an encapsulation characteristic of the encapsulation member deteriorates, thus affecting the durability and the image quality of the display apparatus.

SUMMARY

One or more embodiments of the present invention include a display apparatus and a method of manufacturing the same.

Additional aspects will be set forth in part in the description which follows and, in part, will be apparent from the description, or may be learned by practice of the presented embodiments.

According to one or more embodiments of the present invention, a display apparatus includes a substrate having a central area and a peripheral area around the central area, the central area having a display area. The display apparatus further includes a display area inorganic layer on the display area and extending to a portion of the peripheral area; and an encapsulation inorganic layer on the display area inorganic layer, covering the display area, and having an edge that is in parallel with or extending over an edge of the display area inorganic layer.

The encapsulation inorganic layer may be smaller than the substrate, and the edge of the encapsulation inorganic layer may be spaced from an edge of the substrate.

The display area inorganic layer may be smaller than the substrate, and the edge of the display area inorganic layer may be spaced from an edge of the substrate.

At least one edge of the encapsulation inorganic layer may extend over the edge of the display area inorganic layer and thus may be on the substrate.

The encapsulation inorganic layer may include a main area and a shadow area that is connected to the main area and is closer to an edge of the substrate than the main area is.

The main area may extend over the edge of the display area inorganic layer, and the shadow area may be on the substrate.

An edge of the main area may not extend over the edge of the display area inorganic layer, and the shadow area may contact a side surface of the display area inorganic layer.

The shadow area may have a sloped side surface.

The display apparatus may further include a separate member that is separate from the display area inorganic layer, the shadow area of the encapsulation inorganic layer may not extend over the separate member, and the shadow area may not be closer to an edge of the substrate than the separate member.

The shadow area may contact a side surface of the separate member.

The shadow area may be separate from a side surface of the separate member.

The separate member may include the same material as the display area inorganic layer.

The display apparatus may further include a barrier layer between the substrate and the display area inorganic layer.

At least one edge of the encapsulation inorganic layer may extend over an edge of the barrier layer.

At least one edge of the barrier layer may extend over the edge of the encapsulation inorganic layer.

The display apparatus may further include a separate member that is separate from the display area inorganic layer, and the shadow area of the encapsulation inorganic layer may not extend over the separate member so as not to be closer to an edge of the substrate than the separate member, and the separate member may be on the barrier layer.

The display apparatus may further include a separate member that is separate from the display area inorganic layer, and the shadow area of the encapsulation inorganic layer may not extend over the separate member so as not to be closer to an edge of the substrate than the separate member, and the separate member may include the same material as the barrier layer.

The display apparatus may further include an encapsulation organic layer between the display area inorganic layer and the encapsulation inorganic layer so as to cover the display area.

The encapsulation organic layer may be smaller than the display area inorganic layer.

The encapsulation organic layer may be smaller than the encapsulation inorganic layer.

The display apparatus may further include a blocking member that is closer to an edge of the substrate than the encapsulation organic layer is.

The blocking member may include a plurality of the blocking members.

Heights of the plurality of the blocking members may differ.

The encapsulation inorganic layer may include a plurality of stacked inorganic layers.

The display apparatus may further include an encapsulation organic layer covering the display area, and the encapsulation organic layer may be between the plurality of stacked inorganic layers of the encapsulation inorganic layer and may be smaller than the plurality of stacked inorganic layers.

The encapsulation organic layer may include a plurality of organic layers, and at least one of the plurality of organic layers may be between one of the plurality of stacked inorganic layers of the encapsulation inorganic layer and the display area inorganic layer.

The display apparatus may further include a functional layer between the display area inorganic layer and the encapsulation inorganic layer.

The functional layer may include a layer adapted to control a refractive index of a visible ray.

The display apparatus may further include a first protective layer between the functional layer and the encapsulation inorganic layer.

The display apparatus may further include a second protective layer on the encapsulation inorganic layer, and the second protective layer may be larger than the encapsulation inorganic layer.

The substrate may include an organic material.

The display area may have at least one display device; and a thin film transistor (TFT) electrically connected to the at least one display device and including an active layer, a gate electrode, a source electrode, and a drain electrode, and the display area inorganic layer may contact at least one selected from the active layer, the gate electrode, the source electrode, and the drain electrode.

The display area inorganic layer may correspond to at least one of a gate insulating layer and an interlayer insulating layer, wherein the gate insulating layer may insulate the active layer from the gate electrode and the interlayer insulating layer may insulate the source electrode and the drain electrode from the gate electrode.

The at least one display device may include a first electrode, a second electrode, and an intermediate layer that is between the first electrode and the second electrode and includes an organic emission layer.

According to one or more embodiments of the present invention, a method of manufacturing a display apparatus including a substrate having a central area and a peripheral area around the central area, is provided. The method includes forming a display area inorganic layer on the display area, the display area inorganic layer extending to a portion of the peripheral area; and forming an encapsulation inorganic layer that covers the display area, the encapsulation inorganic layer being located on the display area inorganic layer, and having an edge that is in parallel with or extending over an edge of the display area inorganic layer.

The forming the encapsulation inorganic layer may be performed by using a deposition method.

The forming the encapsulation inorganic layer may include patterning the encapsulation inorganic layer by using a mask so as to make the encapsulation inorganic layer be separate from at least one edge of the substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
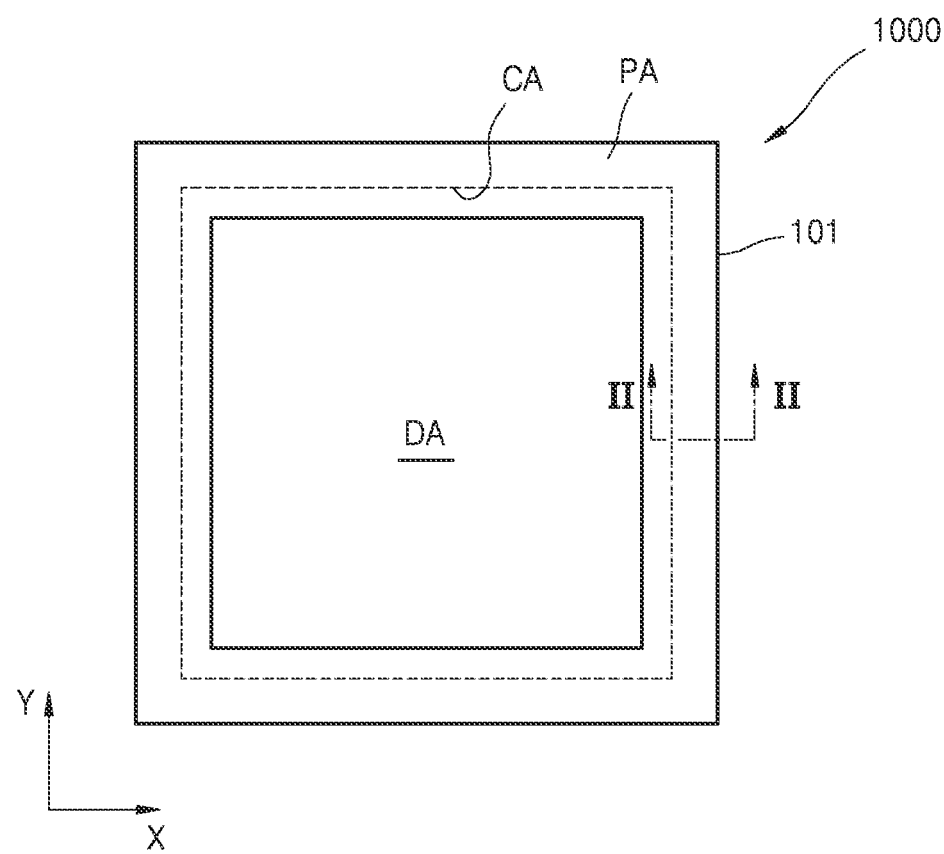
FIG. 1 illustrates a plan view of a display apparatus according to an embodiment of the present invention.

As the present invention allows for various changes and numerous embodiments, particular embodiments will be illustrated in the drawings and described in detail in the written description. Effects and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein.

Hereinafter, in one or more embodiments, while such terms as "first," "second," etc., may be used, such components must not be limited to the above terms, and the above terms are used only to distinguish one component from another.

Hereinafter, in one or more embodiments, a singular form may include plural forms, unless there is a particular description contrary thereto.

Hereinafter, in one or more embodiments, terms such as "comprise," "include," "including," or "comprising" are used to specify existence of a recited feature or component, not excluding the existence of one or more other recited features or one or more other components.

Hereinafter, in one or more embodiments, it will also be understood that when an element such as layer, region, or component is referred to as being "on" another element, it can be directly on the other element, or intervening elements such as layer, region, or component may also be interposed therebetween. Further, when a first element is described as being "coupled" or "connected" to a second element, the first element may be "directly coupled" or "directly connected" to the second element, or may be "indirectly coupled" or "indirectly connected" to the second element with one or more other elements interposed therebetween.

In the drawings, for convenience of description, the sizes of layers and regions are exaggerated for clarity. For example, a size and thickness of each element may be random for convenience of description, thus, one or more embodiments of the present invention are not limited thereto.

Hereinafter, in one or more embodiments, X-axis, Y-axis, and Z-axis may not be limited to three axes on a rectangular coordinate system but may be interpreted as a broad meaning including the three axes. For example, the X-axis, Y-axis, and Z-axis may be perpendicular to each other or may indicate different directions that are not perpendicular to each other.

In one or more embodiments, an order of processes may be different from what is described. For example, two processes that are sequentially described may be concurrently or substantially simultaneously performed, or may be performed in an opposite order to the described order.

Hereinafter, one or more embodiments of the present invention will be described below in more detail with reference to the accompanying drawings. Those components that are the same or are in correspondence are rendered the same reference numeral regardless of the figure number, and redundant explanations are omitted.

As used herein, the term "and/or" includes any and all combinations of one or more of the associated listed items. Expressions such as "at least one of," when preceding a list of elements, modify the entire list of elements and do not modify the individual elements of the list.

Figure 2:
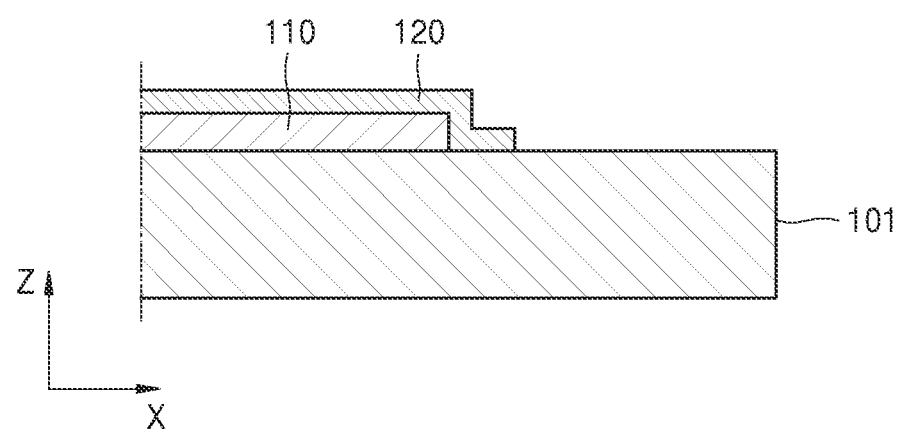
FIG. 2 is a cross-sectional view of the display apparatus, taken along the line II-II of FIG. 1.

FIG. 1 illustrates a plan view of a display apparatus 1000 according to an embodiment of the present invention. FIG. 2 is a cross-sectional view of the display apparatus 1000, taken along the line II-II of FIG. 1.

Referring to FIGS. 1 and 2, the display apparatus 1000 includes a substrate 101. A central area CA having a display area DA and a peripheral area PA disposed around the central area CA are defined on the substrate 101.

A display area inorganic layer 110 and an encapsulation inorganic layer 120 are formed on the substrate 101.

Each of the components/structures is described in more detail below.

The substrate 101 may include various materials. In more detail, the substrate 101 may be formed of a glass material, a metal material, or one or more suitable organic materials and/or other suitable materials.

In an embodiment, the substrate 101 may be a flexible substrate 101. Here, the flexible substrate 101 indicates a substrate having flexibility that is adapted to be bent, curved, folded, and/or rolled (e.g., with relative ease). The flexible substrate 101 may be formed of ultra-thin glass, metal, or plastic. For example, when plastic is used, the substrate 101 may be formed of polyimide (PI) but one or more embodiments are not limited thereto and thus one or more of various suitable materials may be used.

The display apparatus 1000 may be formed in various suitable ways. In an embodiment, a process may be performed on a mother substrate so as to make the mother substrate include a plurality of the display apparatuses 1000, and then a cutting process may be performed so that the plurality of the display apparatuses 1000 may be formed. In another embodiment, one display apparatus 1000 may be formed on one mother substrate.

The substrate 101 is partitioned into the peripheral area PA and the central area CA. In more detail, the peripheral area PA indicates an area adjacent to edges of the substrate 101, and the central area CA indicates an area that is inwardly positioned, compared to the peripheral area PA.

The central area CA may include at least one display area DA.

The display area DA may include at least one display device (not shown), e.g., an organic light-emitting device (OLED) for displaying images. Also, a plurality of pixels may be disposed in the display area DA.

A non-display area (not shown) may be formed around the display area DA. In more detail, the non-display area may be formed surrounding the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not shown) may be formed in the non-display area. In this regard, a driver or a plurality of pad units (not shown) may be disposed in the pad area.

The display area inorganic layer 110 is formed on the substrate 101. In more detail, the display area inorganic layer 110 is formed on the display area DA. For example, the display area inorganic layer 110 may be formed below the display device that is arranged in the display area DA, may be formed adjacent to the display device, or may be formed adjacent to one of a plurality of members included in the display device.

The display area inorganic layer 110 may be formed in the display area DA and may extend over a portion of the peripheral area PA.

In an embodiment, at least one edge from among edges of the display area inorganic layer 110 may be separate from (e.g., spaced from) an edge of the substrate 101. That is, a portion of a top surface of the substrate 101 may not be covered by the display area inorganic layer 110 but may be exposed at an area that corresponds to a gap between the at least one edge of the display area inorganic layer 110 and the edge of the substrate 101.

The display area inorganic layer 110 may be formed of one or more of various suitable inorganic materials.

In an embodiment, the display area inorganic layer 110 may include oxide, nitride, and/or oxynitride. In more detail, the display area inorganic layer 110 may include silicon nitride ($SiN_x$), silicon oxide ($SiO_2$), and/or silicon oxynitride ($SiO_xN_y$).

The peripheral area PA may be disposed adjacent to an edge of the substrate 101. In an embodiment, the peripheral area PA may be disposed adjacent to all edges of the substrate 101.

The encapsulation inorganic layer 120 covers the display area DA on the substrate 101 and is formed on the display area inorganic layer 110. For example, the encapsulation inorganic layer 120 is formed so as to cover the display device that is arranged in the display area DA. By covering the display area DA, in more detail, by covering the display device, the encapsulation inorganic layer 120 may block or may decrease penetration of foreign substances such as moisture or oxygen into the display area DA.

The encapsulation inorganic layer 120 is formed on the display area inorganic layer 110. Also, at least one edge of the encapsulation inorganic layer 120 extends further than an edge of the display area inorganic layer 110. That is, the at least one edge of the encapsulation inorganic layer 120 may exceed (e.g., extend beyond or further than) the edge of the display area inorganic layer 110 and thus may contact the top surface of the substrate 101.

In an embodiment, all edges of the encapsulation inorganic layer 120 may exceed (e.g., extend beyond or further than) respective edges of the display area inorganic layer 110 and thus may contact the top surface of the substrate 101.

The encapsulation inorganic layer 120 may be formed of one or more of various suitable inorganic materials.

In an embodiment, the encapsulation inorganic layer 120 may include oxide, nitride, and/or oxynitride. In more detail, the encapsulation inorganic layer 120 may include silicon nitride ($SiN_x$), silicon oxide ($SiO_2$), and/or silicon oxynitride ($SiO_xN_y$).

Figure 3:
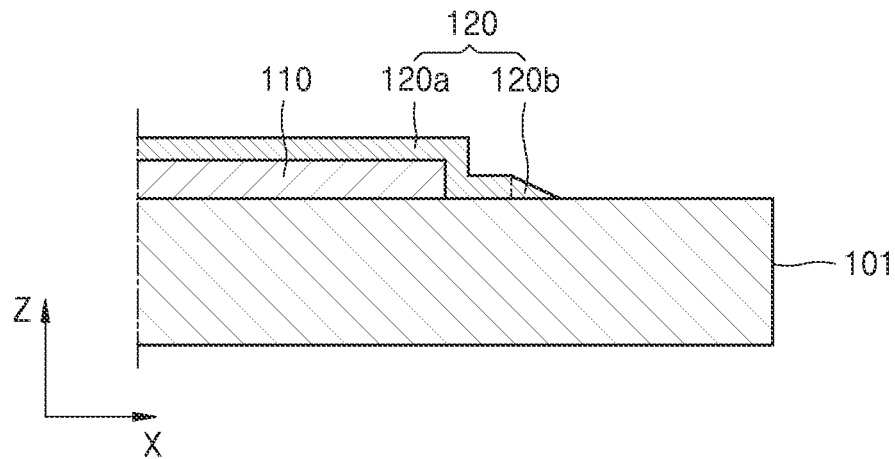
FIGS. 3, 4, 5, 6, 7, 8, 9, 10, and 11 illustrate modified examples of the display apparatus of FIG. 2.

FIG. 3 illustrates a modified example of the display apparatus 1000 of FIG. 2. Referring to FIG. 3, the encapsulation inorganic layer 120 includes a main area 120a and a shadow area 120b. That is, when the encapsulation inorganic layer 120 is formed, e.g., when the encapsulation inorganic layer 120 is formed by deposition using a mask (not shown), the shadow area 120b may be formed via a space between the mask and the substrate 101. The shadow area 120b may have a sloped side surface, and in some cases, the sloped side surface may have a curved surface.

The deposition may be performed in various ways, e.g., chemical vapor deposition (CVD) may be used.

When the encapsulation inorganic layer 120 is formed by deposition using the mask, the encapsulation inorganic layer 120 may have a pattern separate from (e.g., spaced from) an edge of the substrate 101.

The main area 120a of the encapsulation inorganic layer 120 may be formed on the display area inorganic layer 110, may extend over an edge of the display area inorganic layer 110, and thus may contact the top surface of the substrate 101. That is, the main area 120a of the encapsulation inorganic layer 120 is a structure or component that corresponds to the encapsulation inorganic layer 120 of FIG. 2.

The shadow area 120b of the encapsulation inorganic layer 120 may be connected to an edge of the main area 120a, may be separate from (e.g., spaced from) the edge of the display area inorganic layer 110, and may be disposed on (e.g., may be directly on or contact) the substrate 101.

The at least one edge of the encapsulation inorganic layer 120 in the embodiment shown in FIGS. 1 through 3 or all edges of the encapsulation inorganic layer 120 in an embodiment exceed (e.g., extend beyond or further than) respective edges of the display area inorganic layer 110 and thus are formed on (e.g., formed directly on or contact) the top surface of the substrate 101.

That is, since an edge area of the encapsulation inorganic layer 120 contacts the top surface of the substrate 101, it is possible to prevent or substantially prevent the edge of the encapsulation inorganic layer 120 from being delaminated from the display area inorganic layer 110, so that an encapsulation characteristic of the encapsulation inorganic layer 120 may be improved.

In an embodiment, when the substrate 101 is formed of an organic material such as plastic, the encapsulation inorganic layer 120 contacts the top surface of the substrate 101, so that it is possible to efficiently decrease or prevent delamination of the encapsulation inorganic layer 120 from the substrate 101 while the display apparatus 1000 is manufactured or is used. For example, when a high temperature process or a high moisture process is performed during the manufacture of the display apparatus 1000, the encapsulation inorganic layer 120 may contract or expand such that a stress may occur in the encapsulation inorganic layer 120.

Here, the substrate 101 including the organic material may relieve the stress of the encapsulation inorganic layer 120.

By doing so, the display apparatus 1000 having flexibility such as bending or folding for an increase in user convenience may be easily embodied.

Also, since at least one edge of the substrate 101 is separate from (e.g., spaced from) the edge of the encapsulation inorganic layer 120, a portion of the top surface of the substrate 101 is not covered but is exposed in the peripheral area PA that is adjacent to the edge of the substrate 101. The exposed area of the substrate 101 substantially prevents or completely prevents propagation of cracks that occur during a cutting process for separation in the manufacture of the display apparatus 1000.

FIGS. 4 through 11 illustrate modified examples of the display apparatus 1000 of FIG. 2.

Figure 4:
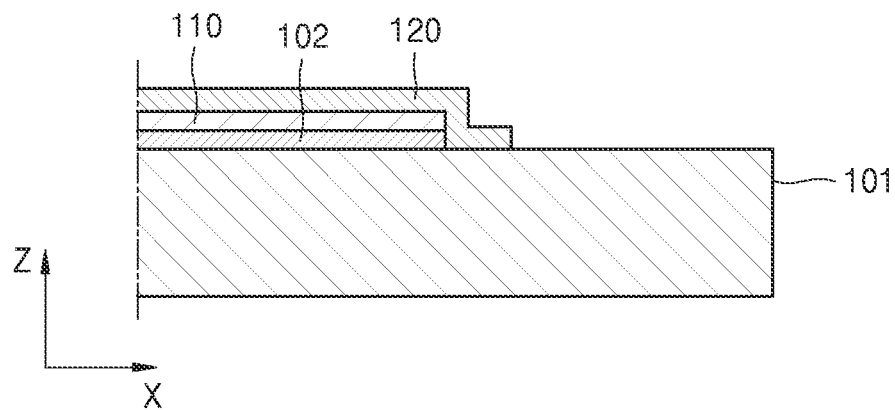

Referring to FIG. 4, a barrier layer 102 is formed on the substrate 101. The barrier layer 102 is disposed between the substrate 101 and the display area inorganic layer 110. The barrier layer 102 may be formed of one or more of various suitable inorganic materials, e.g., the barrier layer 102 may include oxide, nitride, and/or oxynitride. In more detail, the barrier layer 102 may include silicon nitride ($SiN_x$), silicon oxide ($SiO_2$), and/or silicon oxynitride ($SiO_xN_y$).

The encapsulation inorganic layer 120 is formed on the display area inorganic layer 110. Also, at least one edge of the encapsulation inorganic layer 120 exceeds (e.g., extends beyond or further than) edges of the display area inorganic layer 110 and the barrier layer 102. That is, the at least one edge of the encapsulation inorganic layer 120 may exceed (e.g., extend beyond or further than) the edge of the display area inorganic layer 110 and the edge of the barrier layer 102 and then may contact a top surface of the substrate 101.

In an embodiment, all edges of the encapsulation inorganic layer 120 may exceed (e.g., extend beyond or further than) respective edges of the display area inorganic layer 110 and respective edges of the barrier layer 102 and then may contact the top surface of the substrate 101.

In an embodiment, a side surface of the display area inorganic layer 110 and a side surface of the barrier layer 102 may be formed in parallel with each other.

The barrier layer 102 may block or substantially block foreign substances such as moisture or oxygen from penetrating via or through the substrate 101.

Figure 5:
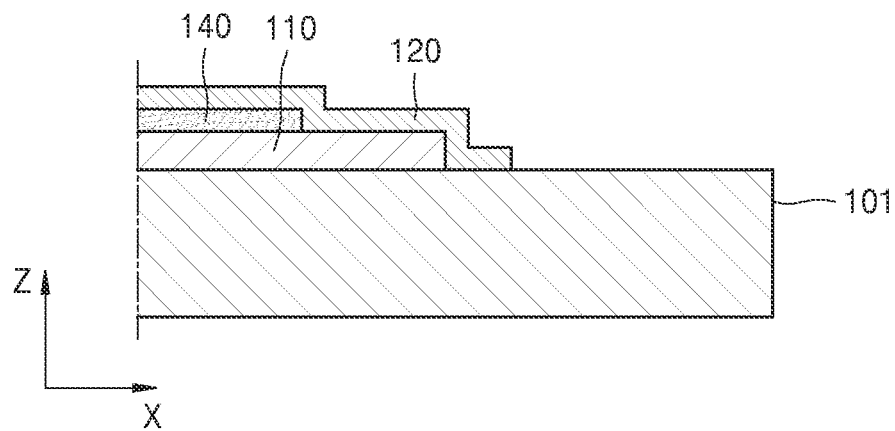

Referring to FIG. 5, an encapsulation organic layer 140 is formed on the display area inorganic layer 110. The encapsulation organic layer 140 is disposed between the display area inorganic layer 110 and the encapsulation inorganic layer 120.

An edge of the encapsulation organic layer 140 does not extend over the edge of the display area inorganic layer 110. That is, the encapsulation organic layer 140 may be formed so as to be smaller than the display area inorganic layer 110. By doing so, the encapsulation organic layer 140 may be separate from (or spaced from) the top surface of the substrate 101.

In an embodiment, the encapsulation organic layer 140 may be formed so as to be smaller than the display area inorganic layer 110 and the encapsulation inorganic layer 120.

The encapsulation organic layer 140 may cover a display area DA on the substrate 101, e.g., the encapsulation organic layer 140 may cover a display device (not shown) that is arranged in the display area DA.

The encapsulation organic layer 140 may block, substantially block or may decrease penetration of foreign substances such as moisture or oxygen into the display area DA.

In particular, the encapsulation organic layer 140 and the encapsulation inorganic layer 120 may be used together and thus may improve an encapsulation characteristic of the encapsulation inorganic layer 120. Also, the encapsulation organic layer 140 may easily form a planar surface.

The encapsulation organic layer 140 may be formed of one or more of various suitable organic materials, e.g., the encapsulation organic layer 140 may include a resin. In an embodiment, the encapsulation organic layer 140 may include an epoxy-based resin, an acryl-based resin, and/or a polyimide-based resin.

Figure 6:
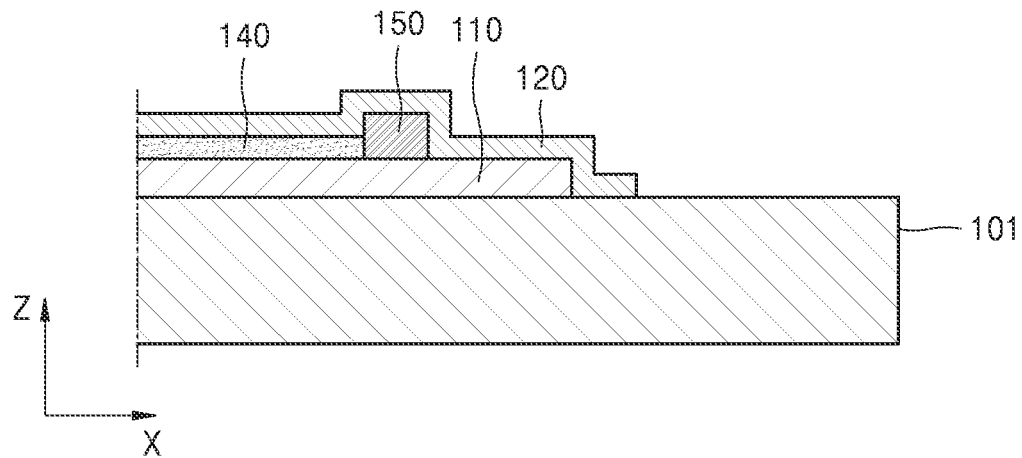

Referring to FIG. 6, a blocking member 150 is further added to a structure shown in FIG. 5. In more detail, the blocking member 150 is formed on the display area inorganic layer 110, and is closer to an edge of the substrate 101 than the encapsulation organic layer 140 is. By doing so, when the encapsulation organic layer 140 is formed, it is possible to decrease, substantially prevent, or prevent overflowing of a material of the encapsulation organic layer 140 or the encapsulation organic layer 140 toward the edge of the substrate 101.

The blocking member 150 may be disposed between the display area inorganic layer 110 and the encapsulation inorganic layer 120.

Figure 7:
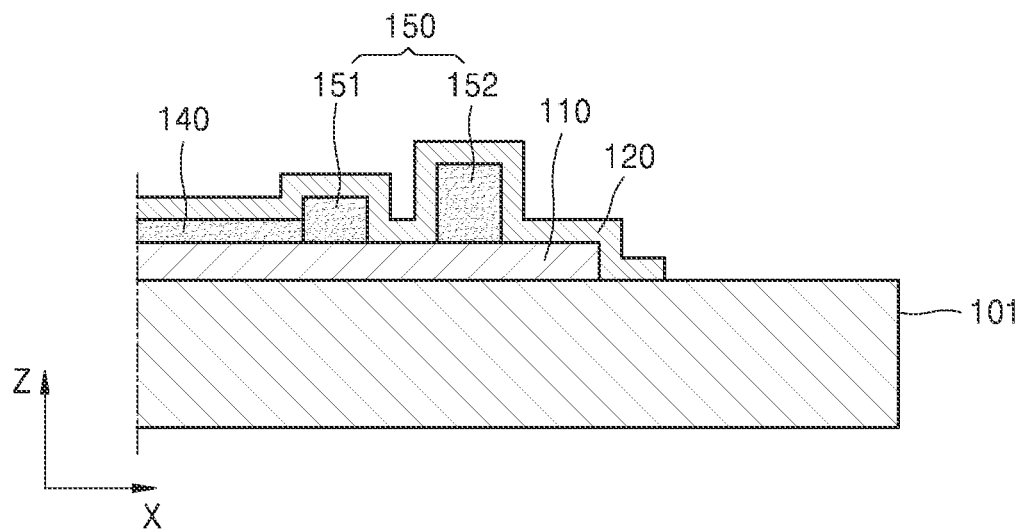

One blocking member 150 may be formed as shown in FIG. 6 or a plurality of the blocking members 150 may be formed as shown in FIG. 7.

Referring to FIG. 7, the blocking member 150 may include a first blocking member 151 and a second blocking member 152, and a height of the second blocking member 152 may be greater than a height of the first blocking member 151. That is, the height of the second blocking member 152 that is closer to the edge of the substrate 101, compared to the blocking member 151, may be greater than the height of the first blocking member 151, and by doing so, when the encapsulation organic layer 140 is formed, an abnormal overflow of the encapsulation organic layer 140 or an abnormal overflow of the material of the encapsulation organic layer 140 may be primarily blocked or substantially blocked by the first blocking member 151 and then may be secondarily and efficiently blocked or substantially blocked by the second blocking member 152.

Although not illustrated, in some embodiments, the blocking member 150 may include at least three blocking members (not shown), and heights of the three blocking members may vary.

Figure 8:
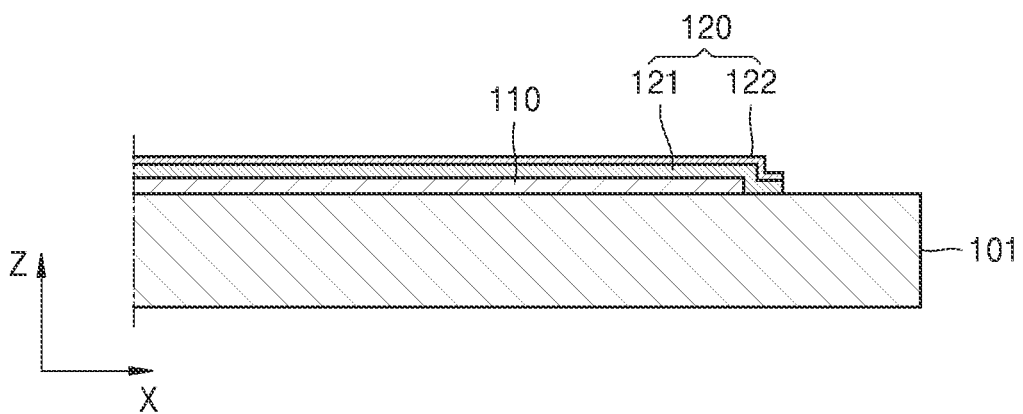

Referring to FIG. 8, the encapsulation inorganic layer 120 includes a plurality of inorganic layers, i.e., a first inorganic layer 121 and a second inorganic layer 122. The first inorganic layer 121 is formed on the display area inorganic layer 110, and the second inorganic layer 122 is formed on the first inorganic layer 121.

The first inorganic layer 121 and the second inorganic layer 122 cover the display area DA on the substrate 101 and are formed on the display area inorganic layer 110. For example, the first inorganic layer 121 and the second inorganic layer 122 may be formed so as to cover a display device (not shown) that is arranged in the display area DA. The first inorganic layer 121 and the second inorganic layer 122 may cover the display area DA, e.g., may cover the display device and thus may block, substantially block or decrease penetration of foreign substances such as moisture or oxygen into the display area DA.

The first inorganic layer 121 and the second inorganic layer 122 are formed on the display area inorganic layer 110. Also, at least one edge of the first inorganic layer 121 and at least one edge of the second inorganic layer 122 may exceed (e.g., extend beyond or further than) an edge of the display area inorganic layer 110. That is, the edges of the first inorganic layer 121 and the second inorganic layer 122 may exceed (e.g., extend beyond or further than) the edge of the display area inorganic layer 110 and then may contact a top surface of the substrate 101.

In an embodiment, all edges of the first inorganic layer 121 and the second inorganic layer 122 may exceed (e.g., extend beyond or further than) respective edges of the display area inorganic layer 110 and then may contact the top surface of the substrate 101.

In an embodiment, a side surface of the first inorganic layer 121 and a side surface of the second inorganic layer 122 may be formed in parallel with each other.

The first inorganic layer 121 and the second inorganic layer 122 may be formed of one or more of various suitable inorganic materials or may be formed by using at least one of the aforementioned materials that form the encapsulation inorganic layer 120. The first inorganic layer 121 and the second inorganic layer 122 may be formed of the same material or different materials.

Although not illustrated in FIG. 8, in some embodiments, the encapsulation inorganic layer 120 may include at least three inorganic layers.

Figure 9:
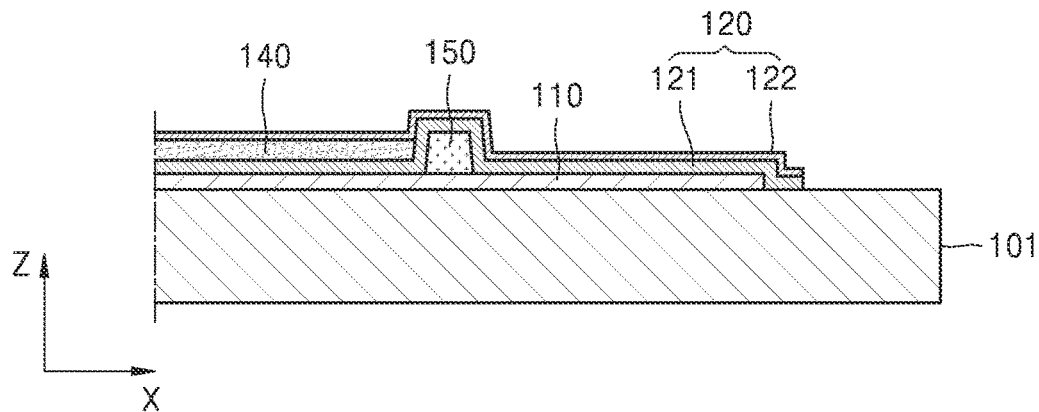

Referring to FIG. 9, as in the embodiment of FIG. 8, the encapsulation inorganic layer 120 includes a plurality of inorganic layers, i.e., the first inorganic layer 121 and the second inorganic layer 122, the encapsulation organic layer 140 is disposed between the first inorganic layer 121 and the second inorganic layer 122, and the blocking member 150 is formed on the display area inorganic layer 110 so as to prevent an overflow of a material of the encapsulation organic layer 140.

Due to a structure in which the encapsulation organic layer 140 is disposed between the first inorganic layer 121 and the second inorganic layer 122, an encapsulation characteristic of the encapsulation inorganic layer 120 may be improved.

Figure 10:
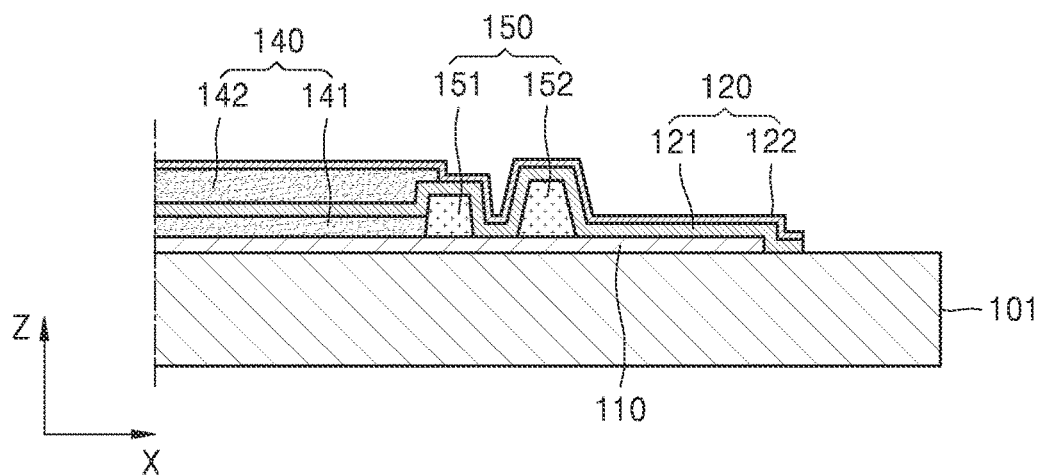

Referring to FIG. 10, the encapsulation inorganic layer 120 includes a plurality of inorganic layers, i.e., the first inorganic layer 121 and the second inorganic layer 122, and the encapsulation organic layer 140 includes a plurality of organic layers, i.e., a first organic layer 141 and a second organic layer 142.

The first organic layer 141 is disposed between the display area inorganic layer 110 and the first inorganic layer 121, and the second organic layer 142 is disposed between the first inorganic layer 121 and the second inorganic layer 122.

The first organic layer 141 and the second organic layer 142 of the encapsulation organic layer 140 may be formed so as to be smaller than the encapsulation inorganic layer 120. That is, compared to edges of the first inorganic layer 121 and the second inorganic layer 122, edges of the first organic layer 141 and the second organic layer 142 may be further distant (e.g., further away or further spaced) from an edge of the substrate 101.

In an embodiment, the second organic layer 142 may be formed so as to be larger than the first organic layer 141. That is, the edge of the second organic layer 142 may be closer to the edge of the substrate 101.

The blocking member 150 is formed on the display area inorganic layer 110 and includes the first blocking member 151 and the second blocking member 152. Due to the first blocking member 151 and the second blocking member 152, an overflow of materials of the first organic layer 141 and the second organic layer 142 may be prevented, substantially prevented or reduced. In particular, a height of the second blocking member 152 is greater than a height of the first blocking member 151, so that the materials of the first organic layer 141 and the second organic layer 142 are primarily blocked or substantially blocked by the first blocking member 151 and then may be blocked or substantially blocked by the second blocking member 152, and since the height of the second blocking member 152 that is adjacent to the edge of the substrate 101 is greater than the height of the first blocking member 151, it is possible to prevent or substantially prevent overflow of the materials of the first organic layer 141 and the second organic layer 142 toward the edge of the substrate 101.

Figure 11:
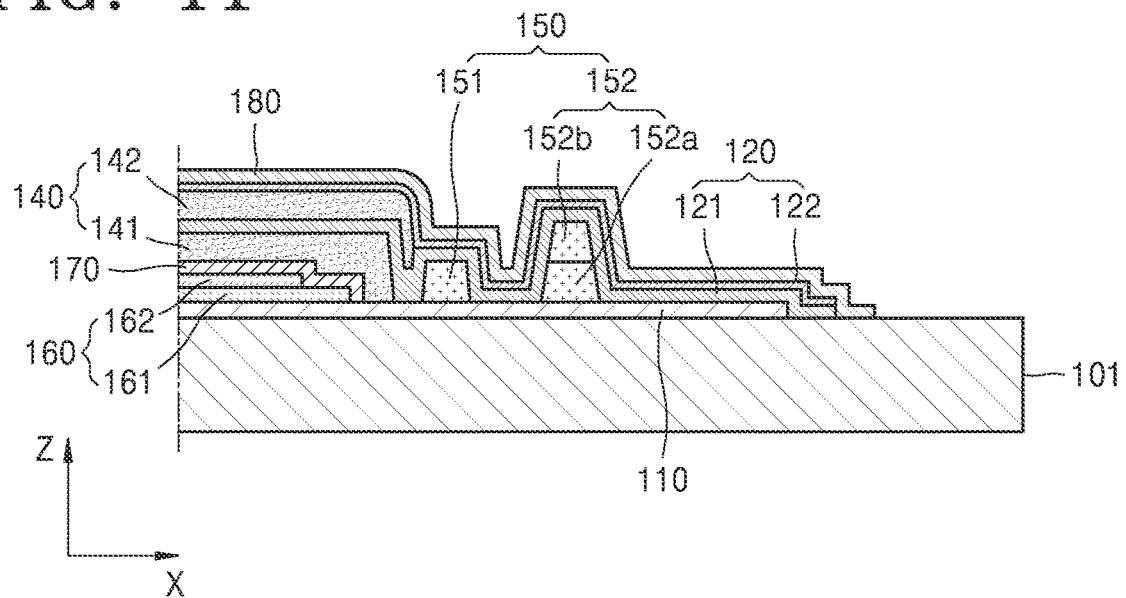

Referring to FIG. 11, compared to the embodiment of FIG. 10, the display apparatus 1000 further includes a functional layer 160, a first protective layer 170, and a second protective layer 180. For convenience of description, the embodiment of FIG. 11 is described with reference to differences therebetween.

The second blocking member 152 of the blocking member 150 includes a first layer 152a and a second layer 152b. However, in another embodiment, the second blocking member 152 may be a single layer as shown in FIG. 10.

The functional layer 160 may include a capping layer 161 and a cover layer 162. The capping layer 161 may protect a top layer of a display device (not shown) that is arranged in the display area DA, may control a refractive index of a visible ray realized by the display device, and thus may improve luminescent efficiency of the display apparatus 1000. Also, the cover layer 162 may be formed on the capping layer 161, may protect the capping layer 161 and the display device, may control a refractive index of a visible ray realized by the display device, and thus may improve luminescent efficiency of the display apparatus 1000. The cover layer 162 may include lithium fluoride (e.g., LiF).

The first protective layer 170 may be formed on the functional layer 160 and below the first organic layer 141. The first protective layer 170 may include an inorganic material, e.g., oxide or nitride. In an embodiment, the first protective layer 170 may include aluminum oxide, e.g., $Al_2O_3$.

In an embodiment, the first protective layer 170 may be formed to be larger than the functional layer 160 and to be smaller than the first organic layer 141. In another embodiment, the first protective layer 170 may be formed to be larger than the first organic layer 141 and the second organic layer 142.

The second protective layer 180 may be formed on the second inorganic layer 122 and may include an inorganic material such as oxide and/or nitride. In an embodiment, the second protective layer 180 may include aluminum oxide, e.g., $Al_2O_3$.

In an embodiment, the second protective layer 180 may be formed so as to be larger than the encapsulation inorganic layer 120 and thus may cover the encapsulation inorganic layer 120, so that an edge of the second protective layer 180 may contact a top surface of the substrate 101. Here, the edge of the second protective layer 180 may be separate from (or spaced from) an edge of the substrate 101, so that a portion of the top surface of the substrate 101 may not be covered by the second protective layer 180 but may be exposed.

By using the second protective layer 180, a delamination problem of the encapsulation inorganic layer 120 may be efficiently decreased or prevented.

Although not illustrated in FIGS. 4 through 11, as illustrated in FIG. 3, the embodiments of FIGS. 4 through 11 and/or other embodiments may have a structure in which the encapsulation inorganic layer 120 includes the main area 120a and the shadow area 120b.

Figure 12:
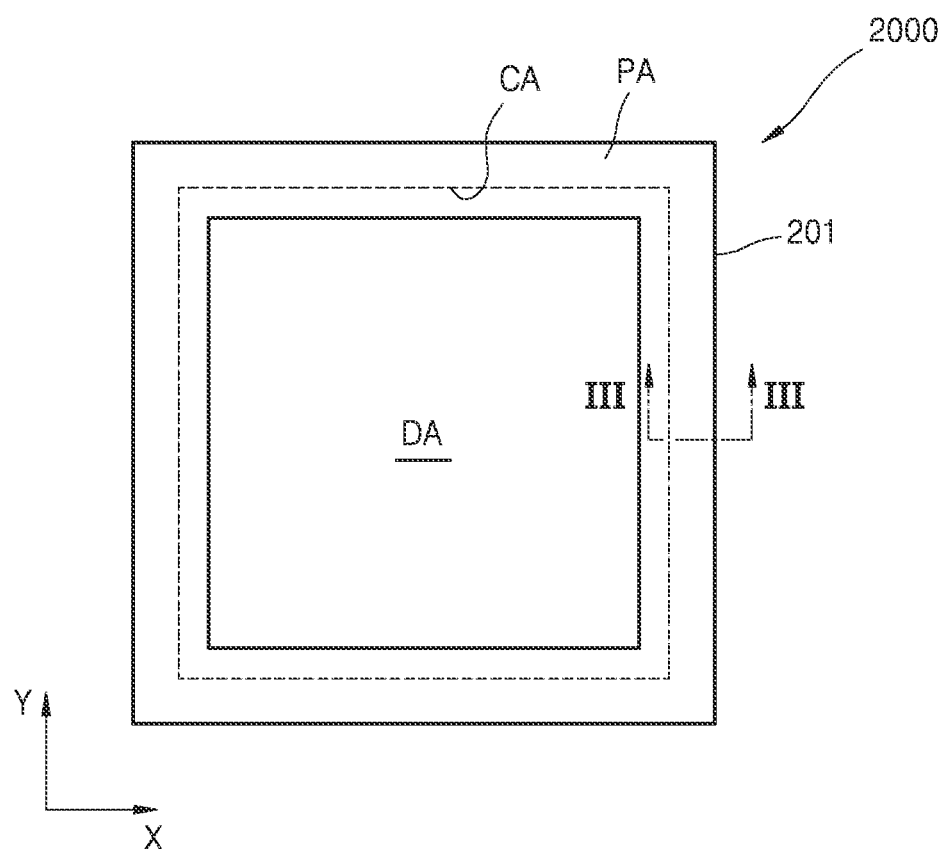
FIG. 12 illustrates a plan view of a display apparatus, according to another embodiment of the present invention.
Figure 13:
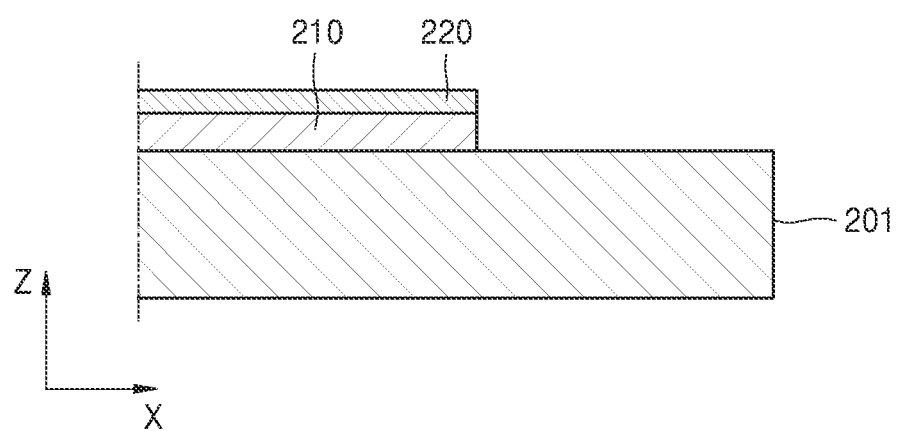
FIG. 13 is a cross-sectional view of the display apparatus, taken along the line III-III of FIG. 12.

FIG. 12 illustrates a plan view of a display apparatus 2000, according to another embodiment of the present invention. FIG. 13 is a cross-sectional view of the display apparatus 2000, taken along the line III-III of FIG. 12.

Referring to FIGS. 12 and 13, the display apparatus 2000 includes a substrate 201. A central area CA having a display area DA and a peripheral area PA disposed around the central area CA are defined on the substrate 201.

A display area inorganic layer 210 and an encapsulation inorganic layer 220 are formed on the substrate 201.

Each of the components/structures is described in detail.

The substrate 201 may include one or more of various suitable materials. In more detail, the substrate 201 may be formed of a glass material, a metal material, one or more suitable organic materials and/or other suitable materials.

In an embodiment, the substrate 201 may be a flexible substrate 201. Here, the flexible substrate 201 indicates a substrate having flexibility that is adapted to be bent, curved, folded, and/or rolled (e.g., with relative ease). The flexible substrate 201 may be formed of ultra-thin glass, metal, or plastic. For example, when plastic is used, the substrate 201 may be formed of polyimide (PI) but one or more embodiments are not limited thereto and thus various materials may be used.

The display apparatus 2000 may be formed in one or more of various suitable ways. In an embodiment, a process may be performed on a mother substrate so as to make the mother substrate include a plurality of the display apparatuses 2000, and then a cutting process may be performed so that the plurality of the display apparatuses 2000 may be formed. In another embodiment, one display apparatus 2000 may be formed on one mother substrate.

The substrate 201 is partitioned into the peripheral area PA and the central area CA. In more detail, the peripheral area PA indicates an area adjacent to edges of the substrate 201, and the central area CA indicates an area that is inwardly positioned, compared to the peripheral area PA.

The central area CA may include at least one display area DA.

The display area DA may include at least one display device (not shown), e.g., an OLED for displaying images. Also, a plurality of pixels may be disposed in the display area DA.

A non-display area (not shown) may be formed around the display area DA. In more detail, the non-display area may be formed surrounding the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not shown) may be formed in the non-display area. In this regard, a driver or a plurality of pad units (not shown) may be disposed in the pad area.

The display area inorganic layer 210 is formed on the substrate 201. In more detail, the display area inorganic layer 210 is formed on the display area DA. For example, the display area inorganic layer 210 may be formed below the display device that is arranged in the display area DA, may be formed adjacent to the display device, or may be formed adjacent to one of a plurality of members or components included in the display device.

The display area inorganic layer 210 may be formed in the display area DA and may extend over a portion of the peripheral area PA.

In an embodiment, at least one edge from among edges of the display area inorganic layer 210 may be separate from (or spaced from) an edge of the substrate 201. That is, a portion of a top surface of the substrate 201 may not be covered by the display area inorganic layer 210 but may be exposed at an area that corresponds to a gap between the at least one edge of the display area inorganic layer 210 and the edge of the substrate 201.

The display area inorganic layer 210 may be formed of one or more of various suitable inorganic materials.

In an embodiment, the display area inorganic layer 210 may include oxide, nitride, and/or oxynitride. In more detail, the display area inorganic layer 210 may include silicon nitride ($SiN_x$), silicon oxide ($SiO_2$), and/or silicon oxynitride ($SiO_xN_y$).

The peripheral area PA may be disposed adjacent to an edge of the substrate 201. In an embodiment, the peripheral area PA may be disposed adjacent to all edges of the substrate 201.

The encapsulation inorganic layer 220 covers the display area DA on the substrate 201 and is formed on the display area inorganic layer 210. For example, the encapsulation inorganic layer 220 is formed so as to cover the display device that is arranged in the display area DA. By covering the display area DA, in more detail, by covering the display device, the encapsulation inorganic layer 220 may block, substantially block or may decrease penetration of foreign substances such as moisture or oxygen into the display area DA.

The encapsulation inorganic layer 220 is formed on the display area inorganic layer 210. Also, at least one edge of the encapsulation inorganic layer 220 is formed in parallel with an edge of the display area inorganic layer 210. That is, at least one side surface of the encapsulation inorganic layer 220 may be formed in parallel with a side surface of the display area inorganic layer 210.

In an embodiment, all edges of the encapsulation inorganic layer 220 may be formed in parallel with respective edges of the display area inorganic layer 210.

The encapsulation inorganic layer 220 may be formed of one or more of various suitable inorganic materials.

In an embodiment, the encapsulation inorganic layer 120 may include oxide, nitride, and/or oxynitride. In more detail, the encapsulation inorganic layer 220 may include silicon nitride ($SiN_x$), silicon oxide ($SiO_2$), and/or silicon oxynitride ($SiO_xN_y$).

Figure 14:
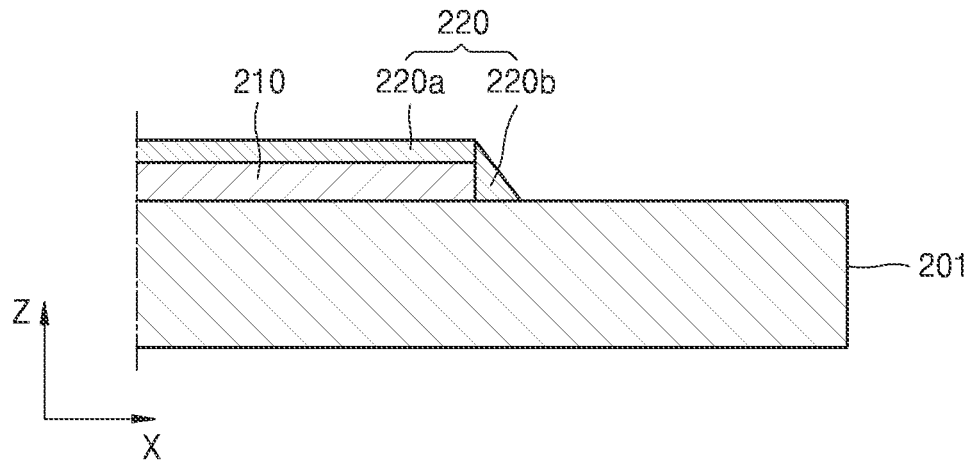
FIGS. 14, 15, 16, 17, 18, 19, 20, 21, 22, and 23 illustrate modified examples of the display apparatus of FIG. 13.

FIG. 14 illustrates a modified example of the display apparatus 2000 of FIG. 13. Referring to FIG. 14, the encapsulation inorganic layer 220 includes a main area 220a and a shadow area 220b. That is, when the encapsulation inorganic layer 220 is formed, e.g., when the encapsulation inorganic layer 220 is formed by deposition using a mask (not shown), the shadow area 220b may be formed via a space between the mask and the substrate 201. The shadow area 220b may have a sloped side surface, and in some cases, the sloped side surface may have a curved surface. The shadow area 220b contacts the side surface of the display area inorganic layer 210 and contacts the top surface of the substrate 201.

The main area 220a of the encapsulation inorganic layer 220 is formed on the display area inorganic layer 210, is in parallel with the edge of the display area inorganic layer 210, and does not extend over the edge of the display area inorganic layer 210. That is, the main area 220a of the encapsulation inorganic layer 220 is a component or structure that corresponds to the encapsulation inorganic layer 220 of FIG. 13.

The shadow area 220b of the encapsulation inorganic layer 220 is connected to an edge of the main area 220a and is separate from (or spaced from) the edge of the substrate 201.

The at least one edge of the encapsulation inorganic layer 220 in the embodiment of FIGS. 12 through 14 or all edges of the encapsulation inorganic layer 220 in another embodiment are formed in parallel with one or more edges of the display area inorganic layer 210.

By doing so, it is possible to prevent or substantially prevent, or to decrease delamination of the at least one edge of the encapsulation inorganic layer 220 from the display area inorganic layer 210, such delamination resulting in deterioration or elimination of an encapsulation characteristic of the encapsulation inorganic layer 220. In particular, even when the shadow area 220b is formed as illustrated in FIG. 14, the shadow area 220b is not formed on a top surface of the display area inorganic layer 210 but is formed at the side surface of the display area inorganic layer 210 and the top surface of the substrate 201. Therefore, it is possible to prevent or substantially prevent, or to decrease delamination of the shadow area 220b from the display area inorganic layer 210.

In an embodiment, when the substrate 201 is formed of an organic material such as plastic, the encapsulation inorganic layer 220 and the shadow area 220b of the encapsulation inorganic layer 220 contact the top surface of the substrate 201, so that it is possible to efficiently decrease delamination of the encapsulation inorganic layer 220 from the substrate 201 while the display apparatus 2000 is manufactured or is used. For example, when a high temperature process or a high moisture process is performed during the manufacture of the display apparatus 2000, the encapsulation inorganic layer 220 may contract or expand such that a stress may occur in the encapsulation inorganic layer 220. Here, the substrate 101 including the organic material may relieve the stress of the encapsulation inorganic layer 220.

By doing so, the display apparatus 2000 having flexibility such as bending or folding for an increase in user convenience may be easily embodied.

Also, since at least one edge of the substrate 201 is separate from (or spaced from) the edge of the encapsulation inorganic layer 220, a portion of the top surface of the substrate 201 is not covered but is exposed in the peripheral area PA that is adjacent to the edge of the substrate 201. The exposed area of the substrate 201 completely prevents, substantially prevents or reduces propagation of cracks that occur during a cutting process for separation in the manufacture of the display apparatus 2000. Also, the flexibility of the display apparatus 2000 is improved so that user convenience may be increased.

Figure 15:
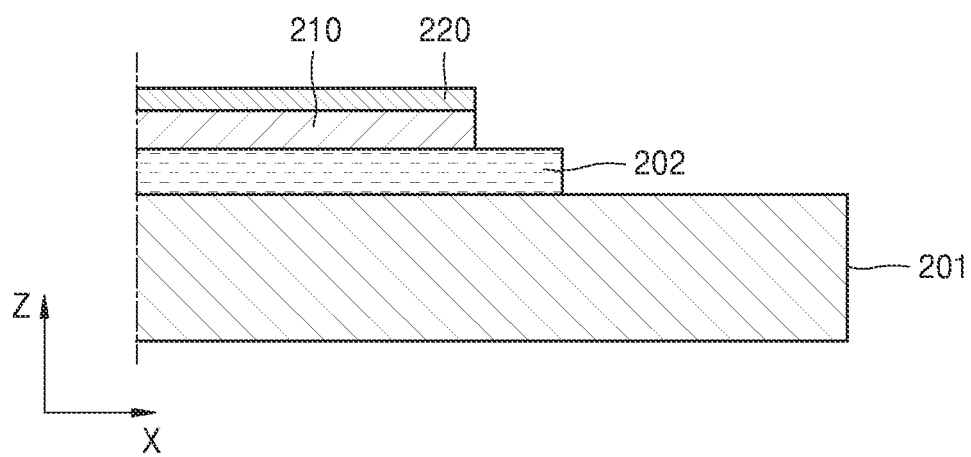

FIG. 15 illustrates a modified example of the display apparatus 2000 of FIG. 13.

Referring to FIG. 15, a barrier layer 202 is formed on the substrate 201. The barrier layer 202 is disposed between the substrate 201 and the display area inorganic layer 210. The barrier layer 202 may be formed of one or more of various suitable inorganic materials, e.g., the barrier layer 202 may include oxide, nitride, and/or oxynitride. In more detail, the barrier layer 202 may include silicon nitride ($SiN_x$), silicon oxide ($SiO_2$), and/or silicon oxynitride ($SiO_xN_y$).

The barrier layer 202 may be formed so as to be larger than the display area inorganic layer 210. The barrier layer 202 may be separate from (or spaced from) an edge of the substrate 201, i.e., the barrier layer 202 may be formed so as to be smaller than the substrate 201.

The encapsulation inorganic layer 220 is formed on the display area inorganic layer 210. The barrier layer 202 may be larger than the encapsulation inorganic layer 220.

Figure 16:
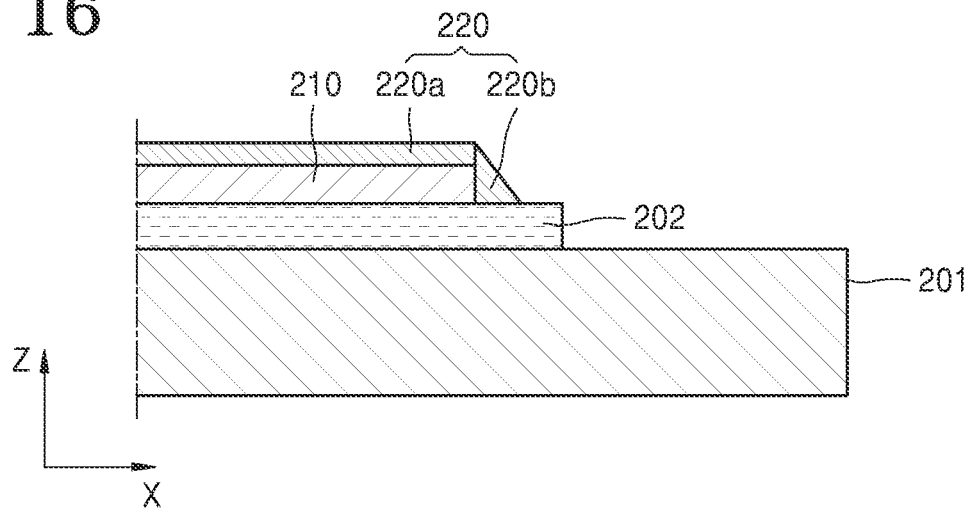

In an embodiment, as illustrated in FIG. 16, the encapsulation inorganic layer 220 may include a main area 220*a* and a shadow area 220*b*. The main area 220*a* of the encapsulation inorganic layer 220 is formed on the display area inorganic layer 210, is in parallel with the edge of the display area inorganic layer 210, and does not extend over the edge of the display area inorganic layer 210.

The shadow area 220*b* of the encapsulation inorganic layer 220 may be connected to an edge of the main area 220*a* and thus may contact a side surface of the display area inorganic layer 210 and a top surface of the barrier layer 202.

The barrier layer 202 may block or substantially block foreign substances such as moisture or oxygen from penetrating via or through the substrate 201.

FIGS. 17 through 23 illustrate modified examples of the display apparatus 2000 of FIG. 13.

Figure 17:
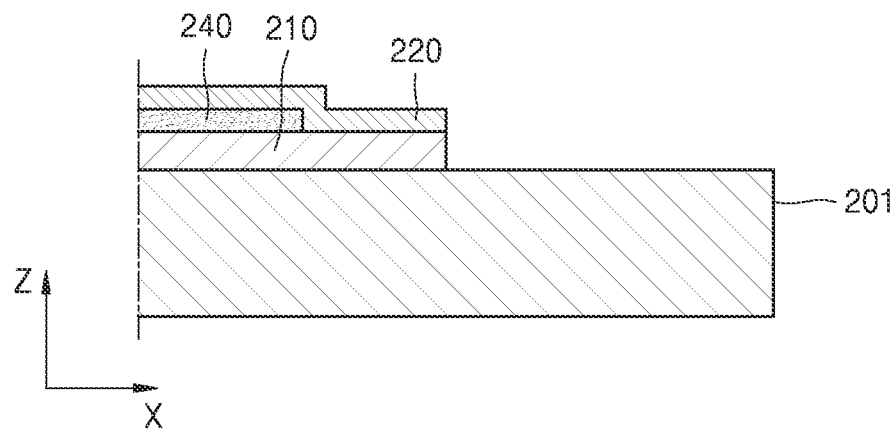

Referring to FIG. 17, an encapsulation organic layer 240 is formed on the display area inorganic layer 210. The encapsulation organic layer 240 is disposed between the display area inorganic layer 210 and the encapsulation inorganic layer 220.

An edge of the encapsulation organic layer 240 does not extend over an edge of the display area inorganic layer 210. That is, the encapsulation organic layer 240 may be formed so as to be smaller than the display area inorganic layer 210. By doing so, the encapsulation organic layer 240 may be separate from (or spaced from) a top surface of the substrate 201.

In an embodiment, the encapsulation organic layer 240 may be formed so as to be smaller than the display area inorganic layer 210 and the encapsulation inorganic layer 220.

The encapsulation organic layer 240 may cover a display area DA on the substrate 201, e.g., the encapsulation organic layer 240 may cover a display device (not shown) that is arranged in the display area DA.

The encapsulation organic layer 240 may block or substantially block, or may decrease penetration of foreign substances such as moisture or oxygen into the display area DA. In particular, the encapsulation organic layer 240 and the encapsulation inorganic layer 220 may be used together and thus may improve an encapsulation characteristic of the encapsulation inorganic layer 220. Also, the encapsulation organic layer 240 may easily form a planar surface.

The encapsulation organic layer 240 may be formed of one or more of various suitable organic materials, e.g., the encapsulation organic layer 240 may include a resin. In an embodiment, the encapsulation organic layer 240 may include an epoxy-based resin, an acryl-based resin, and/or a polyimide-based resin.

Figure 18:
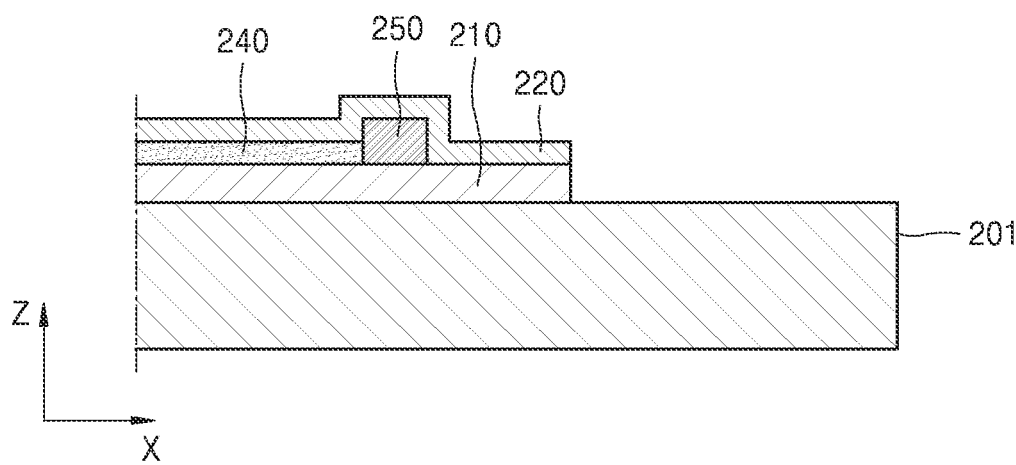

Referring to FIG. 18, a blocking member 250 is further added to a structure shown in FIG. 17. In more detail, the blocking member 250 is formed on the display area inorganic layer 210 so as to be closer to an edge of the substrate 201 than the encapsulation organic layer 240. By doing so, when the encapsulation organic layer 240 is formed, it is possible to decrease, prevent, or substantially prevent overflow of a material of the encapsulation organic layer 240 or the encapsulation organic layer 240 toward the edge of the substrate 201.

The blocking member 250 may be disposed between the display area inorganic layer 210 and the encapsulation inorganic layer 220.

Figure 19:
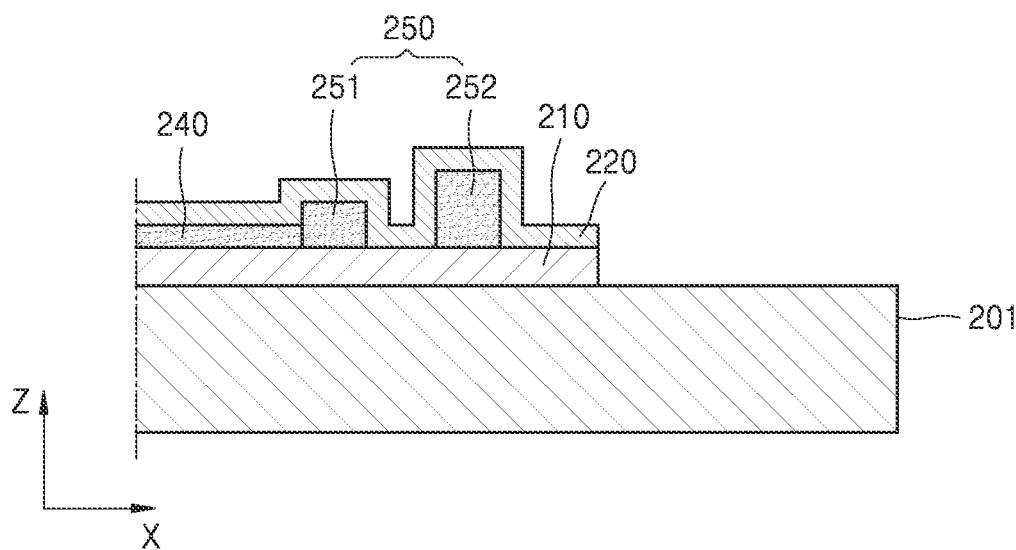

One blocking member 250 may be formed as shown in FIG. 18 or a plurality of the blocking members 250 may be formed as shown in FIG. 19.

Referring to FIG. 19, the blocking member 250 may include a first blocking member 251 and a second blocking member 252, and a height of the second blocking member 252 is greater than a height of the first blocking member 251. That is, the height of the second blocking member 252 that is closer to the edge of the substrate 201, compared to the blocking member 251, may be greater than the height of the first blocking member 251, and by doing so, when the encapsulation organic layer 240 is formed, an abnormal overflow of the encapsulation organic layer 240 or an abnormal overflow of a material of the encapsulation organic layer 240 may be primarily blocked or substantially blocked by the first blocking member 251 and then may be secondarily and efficiently blocked or substantially blocked by the second blocking member 252.

Although not illustrated, the blocking member 250 may include at least three blocking members (not shown), and heights of the three blocking members may vary.

Figure 20:
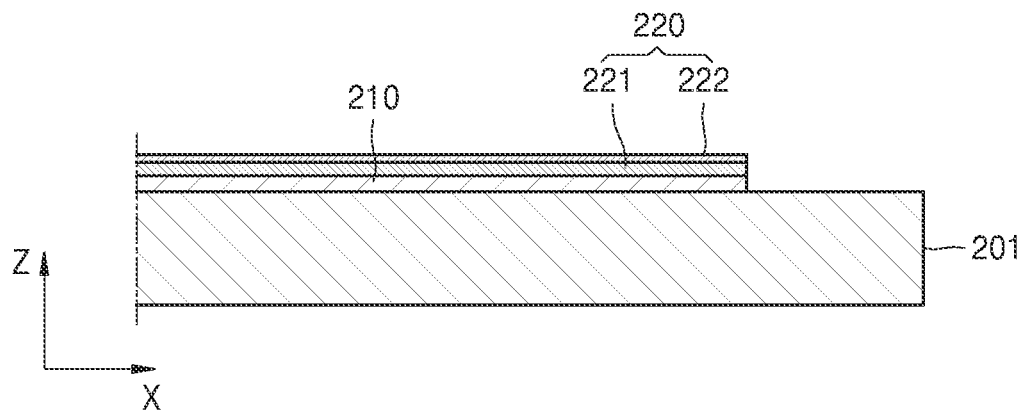

Referring to FIG. 20, the encapsulation inorganic layer 220 includes a plurality of inorganic layers, i.e., a first inorganic layer 221 and a second inorganic layer 222. The first inorganic layer 221 is formed on the display area inorganic layer 210, and the second inorganic layer 222 is formed on the first inorganic layer 221.

The first inorganic layer 221 and the second inorganic layer 222 cover the display area DA on the substrate 201 and are formed on the display area inorganic layer 210. For example, the first inorganic layer 221 and the second inorganic layer 222 may be formed so as to cover a display device (not shown) that is arranged in the display area DA. The first inorganic layer 221 and the second inorganic layer 222 may cover the display area DA, e.g., may cover the display device and thus may block, substantially block, or decrease penetration of foreign substances such as moisture or oxygen into the display area DA.

The first inorganic layer 221 and the second inorganic layer 222 are formed on the display area inorganic layer 210. Also, at least one edge of the first inorganic layer 221 and at least one edge of the second inorganic layer 222 may be formed in parallel with an edge of the display area inorganic layer 210.

In an embodiment, a side surface of the first inorganic layer 221 and a side surface of the second inorganic layer 222 may be formed in parallel with each other.

In another embodiment, an edge of the first inorganic layer 221 and an edge of the second inorganic layer 222 may be formed in parallel with the edge of the display area inorganic layer 210.

The first inorganic layer 221 and the second inorganic layer 222 may be formed of one or more of various suitable inorganic materials or may be formed by using at least one of the aforementioned materials that form the encapsulation inorganic layer 220. The first inorganic layer 221 and the second inorganic layer 222 may be formed of the same material or different materials.

Although not illustrated in FIG. 20, in some embodiments, the encapsulation inorganic layer 220 may include at least three inorganic layers.

Figure 21:
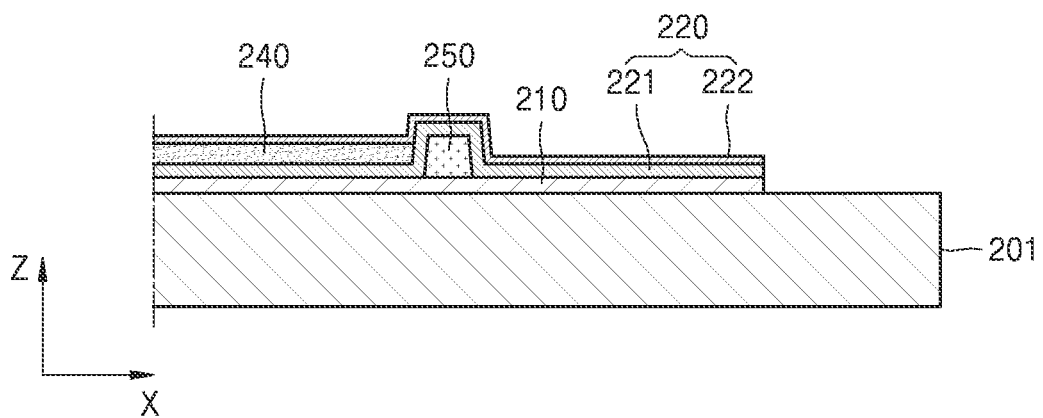

Referring to FIG. 21, as in the embodiment of FIG. 20, the encapsulation inorganic layer 220 includes a plurality of inorganic layers, i.e., the first inorganic layer 221 and the second inorganic layer 222, the encapsulation organic layer 240 is disposed between the first inorganic layer 221 and the second inorganic layer 222, and the blocking member 250 is formed on the display area inorganic layer 210 so as to prevent or substantially prevent an overflow of the material of the encapsulation organic layer 240.

Due to a structure in which the encapsulation organic layer 240 is disposed between the first inorganic layer 221 and the second inorganic layer 222, an encapsulation characteristic of the encapsulation inorganic layer 220 may be improved.

Figure 22:
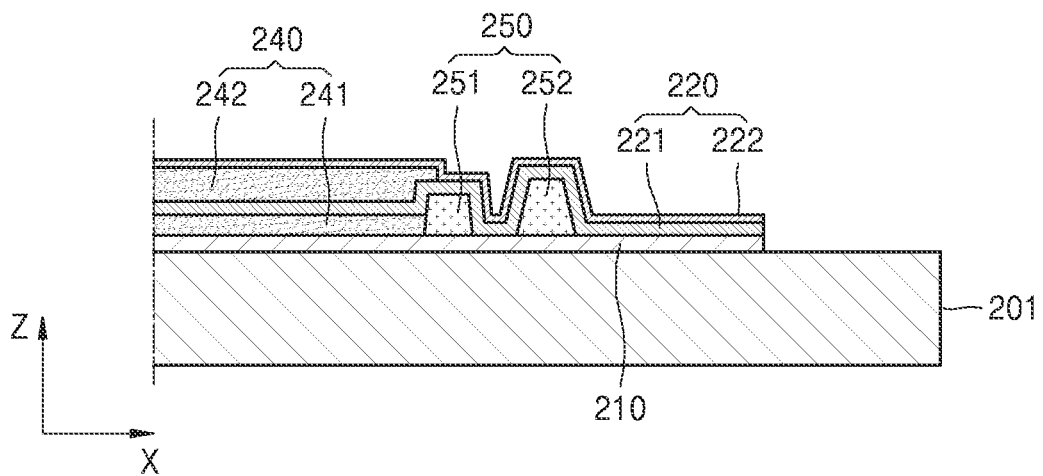

Referring to FIG. 22, the encapsulation inorganic layer 220 includes a plurality of inorganic layers, i.e., the first inorganic layer 221 and the second inorganic layer 222, and the encapsulation organic layer 240 includes a plurality of organic layers, i.e., a first organic layer 241 and a second organic layer 242.

The first organic layer 241 is disposed between the display area inorganic layer 210 and the first inorganic layer 221, and the second organic layer 242 is disposed between the first inorganic layer 221 and the second inorganic layer 222.

In an embodiment, the second organic layer 242 may be formed so as to be larger than the first organic layer 241.

The blocking member 250 is formed on the display area inorganic layer 210 and includes the first blocking member 251 and the second blocking member 152. Due to the first blocking member 251 and the second blocking member 252, an overflow of materials of the first organic layer 241 and the second organic layer 242 may be prevented or substantially prevented.

Figure 23:
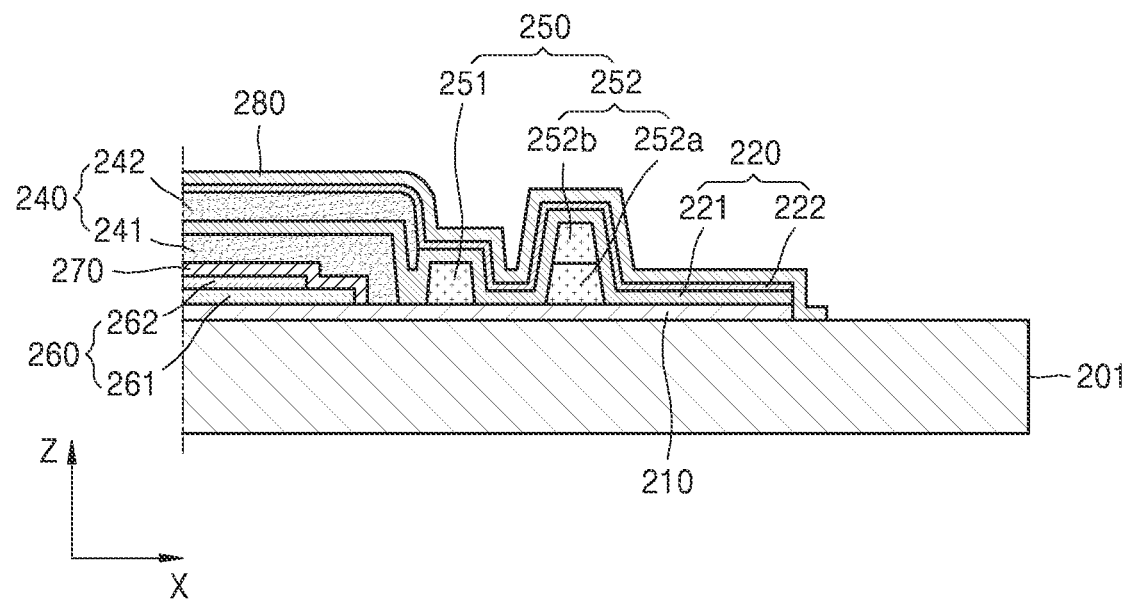

Referring to FIG. 22, compared to the embodiment of FIG. 23, the display apparatus 2000 further includes a functional layer 260, a first protective layer 270, and a second protective layer 280. For convenience of description, the embodiment of FIG. 22 is described with reference to differences therebetween.

The second blocking member 252 of the blocking member 250 includes a first layer 252a and a second layer 252b. However, in another embodiment, the second blocking member 252 may be a single layer.

The functional layer 260 may include a capping layer 261 and a cover layer 262. The capping layer 261 may protect a top layer of a display device (not shown) that is arranged in the display area DA, may control a refractive index of a visible ray realized by the display device, and thus may improve luminescent efficiency of the display apparatus 2000. Also, the cover layer 262 may be formed on the capping layer 261, may protect the capping layer 261 and the display device, may control a refractive index of a visible ray realized by the display device, and thus may improve luminescent efficiency of the display apparatus 2000. The cover layer 262 may include lithium fluoride (e.g., LiF).

The first protective layer 270 may be formed on the functional layer 260 and below the first organic layer 241. The first protective layer 270 may include an inorganic material, e.g., oxide or nitride. In an embodiment, the first protective layer 270 may include aluminum oxide, e.g., $Al_2O_3$.

In an embodiment, the first protective layer 270 may be formed to be larger than the functional layer 260 and to be smaller than the first organic layer 241. In another embodiment, the first protective layer 270 may be formed to be larger than the first organic layer 241 and the second organic layer 242.

The second protective layer 280 may be formed on the second inorganic layer 222 and may include an inorganic material such as oxide and/or nitride. In an embodiment, the second protective layer 280 may include aluminum oxide, e.g., $Al_2O_3$.

In an embodiment, the second protective layer 280 may be formed so as to be larger than the encapsulation inorganic layer 220 and thus may cover the encapsulation inorganic layer 220, so that an edge of the second protective layer 280 may contact a top surface of the substrate 201. Here, the edge of the second protective layer 280 may be separate from (or spaced from) an edge of the substrate 201, so that a portion of the top surface of the substrate 201 may not be covered by the second protective layer 280 but may be exposed.

By using the second protective layer 280, a delamination problem of the encapsulation inorganic layer 220 may be efficiently decreased or prevented.

Although not illustrated in FIGS. 17 through 23, as illustrated in FIG. 14 or 16, the embodiments of FIGS. 17 through 23 may have a structure in which the encapsulation inorganic layer 220 includes the main area 220a and the shadow area 220b.

Figure 24:
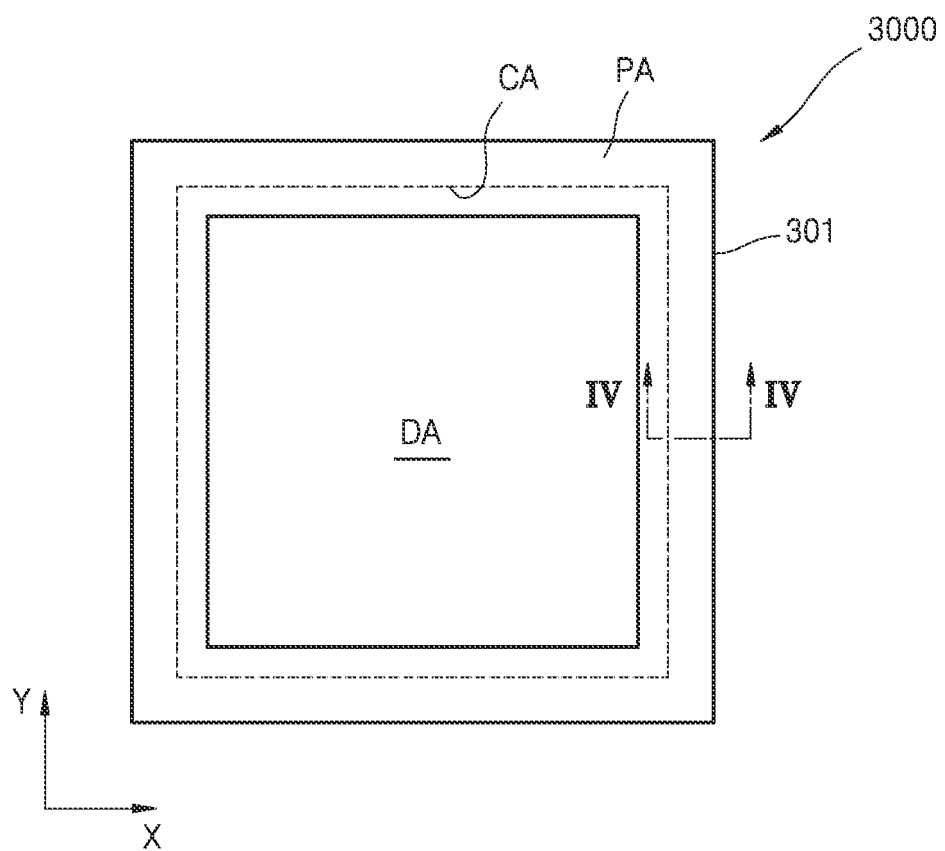
FIG. 24 illustrates a plan view of a display apparatus according to another embodiment of the present invention.
Figure 25:
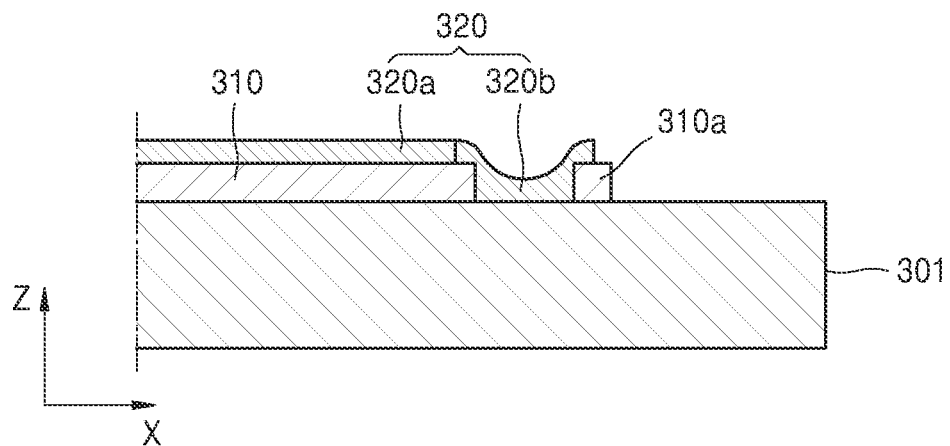
FIG. 25 is a cross-sectional view of the display apparatus, taken along the line IV-IV of FIG. 24.
Figure 26:
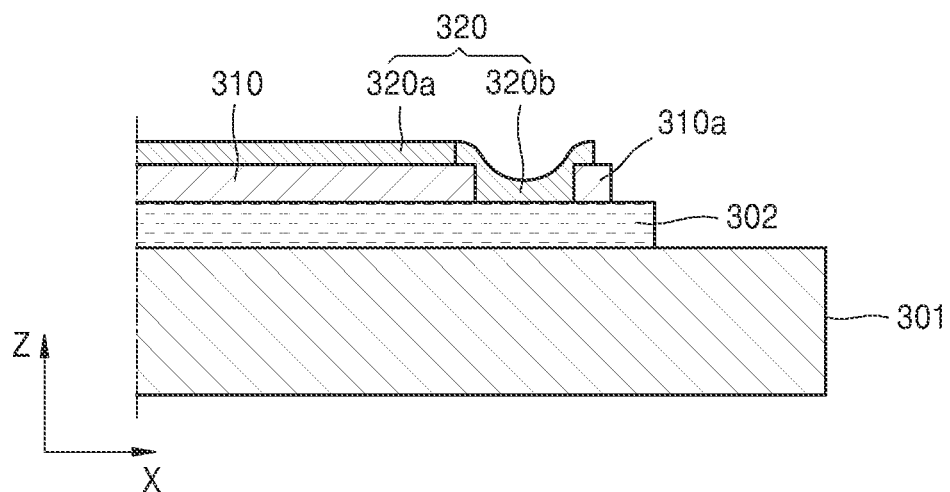
FIGS. 26, 27, and 28 illustrate modified examples of the display apparatus of FIG. 25.
Figure 27:
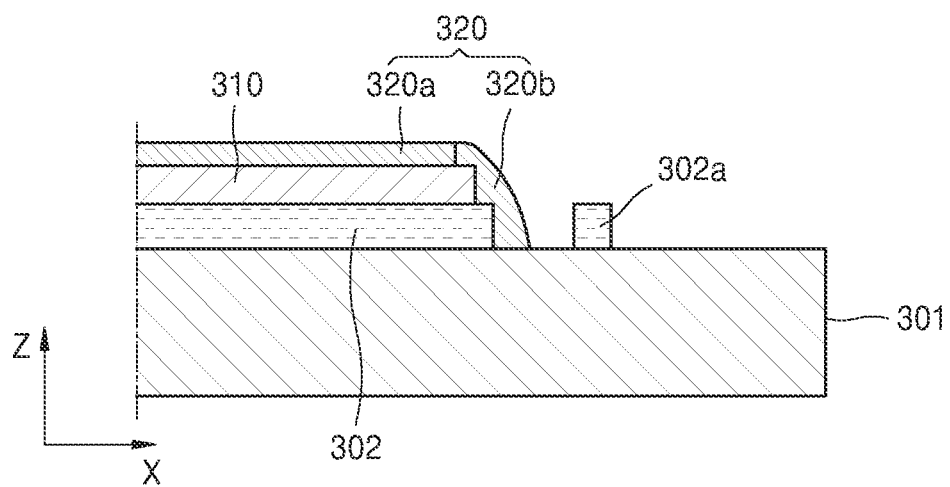
Figure 28:
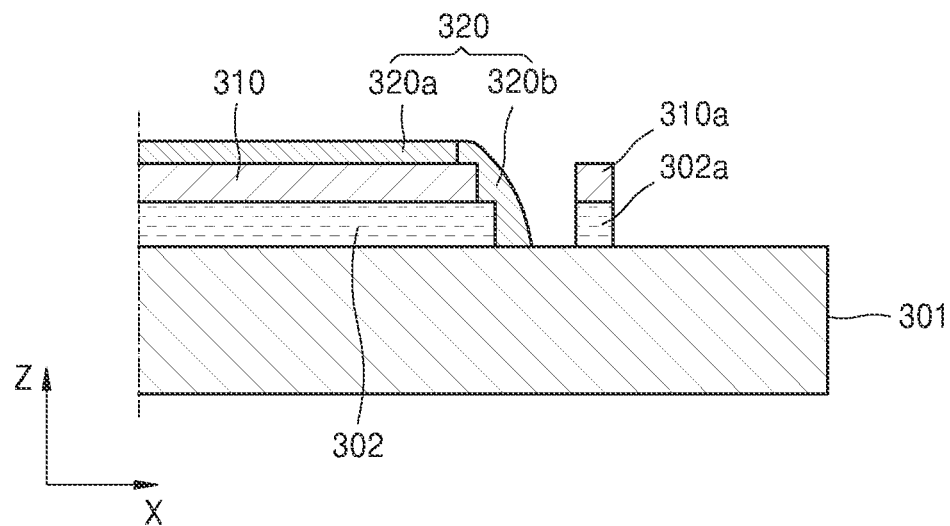

FIG. 24 illustrates a plan view of a display apparatus 3000, according to another embodiment of the present invention. FIG. 25 is a cross-sectional view of the display apparatus 3000, taken along the line IV-IV of FIG. 24. FIGS. 26 through 28 illustrate modified examples of the display apparatus 3000 of FIG. 25.

Referring to FIGS. 24 and 25, the display apparatus 3000 includes a substrate 301. A central area CA having a display area DA and a peripheral area PA disposed around the central area CA are defined on the substrate 301.

A display area inorganic layer 310 and an encapsulation inorganic layer 320 are formed on the substrate 301.

Each of the components/structures is described in detail.

The substrate 301 may include one or more of various suitable materials. In more detail, the substrate 301 may be formed of a glass material, a metal material, one or more suitable organic materials, and/or other suitable materials.

In an embodiment, the substrate 301 may be a flexible substrate 301. Here, the flexible substrate 301 indicates a substrate having flexibility that is adapted to be bent, curved, folded, and/or rolled (e.g., with relative ease). The flexible substrate 301 may be formed of ultra-thin glass, metal, and/or plastic. For example, when plastic is used, the substrate 301 may be formed of polyimide (PI) but one or more embodiments are not limited thereto and thus one or more of various suitable materials may be used.

The display apparatus 3000 may be formed in one or more of various suitable ways. In an embodiment, a process may be performed on a mother substrate so as to make the mother substrate include a plurality of the display apparatuses 3000, and then a cutting process may be performed so that the plurality of the display apparatuses 3000 may be formed. In another embodiment, one display apparatus 3000 may be formed on one mother substrate.

The substrate 301 is partitioned into the peripheral area PA and the central area CA. In more detail, the peripheral area PA indicates an area adjacent to edges of the substrate 301, and the central area CA indicates an area that is inwardly positioned, compared to the peripheral area PA.

The central area CA may include at least one display area DA.

The display area DA may include at least one display device (not shown), e.g., an OLED for displaying images. Also, a plurality of pixels may be disposed in the display area DA.

A non-display area (not shown) may be formed around the display area DA. In more detail, the non-display area may be formed surrounding the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not shown) may be formed in the non-display area. In this regard, a driver or a plurality of pad units (not shown) may be disposed in the pad area.

The display area inorganic layer 310 is formed on the substrate 301. In more detail, the display area inorganic layer 310 is formed on the display area DA. For example, the display area inorganic layer 310 may be formed below the display device that is arranged in the display area DA, may be formed adjacent to the display device, or may be formed adjacent to one of a plurality of members or components included in the display device.

The display area inorganic layer 310 may be formed in the display area DA and may extend over a portion of the peripheral area PA.

In an embodiment, at least one edge from among edges of the display area inorganic layer 310 may be separate from (or spaced from) an edge of the substrate 301. That is, a portion of a top surface of the substrate 301 may not be covered by the display area inorganic layer 310 but may be exposed at an area that corresponds to a gap between the at least one edge of the display area inorganic layer 310 and the edge of the substrate 301.

The display area inorganic layer 310 may be formed of one or more of various suitable inorganic materials.

In an embodiment, the display area inorganic layer 310 may include oxide, nitride, and/or oxynitride. In more detail, the display area inorganic layer 310 may include silicon nitride ($SiN_x$), silicon oxide ($SiO_2$), and/or silicon oxynitride ($SiO_xN_y$).

A separate member 310a that is separate from (or spaced from) the display area inorganic layer 310 is formed. The separate member 310a may be disposed closer to the edge of the substrate 301 than the at least one edge of the display area inorganic layer 310 may be.

In an embodiment, the separate member 310a may be separate from (or spaced from) the edge of the substrate 301.

In an embodiment, the separate member 310a may be formed of the same material as the display area inorganic layer 310, and in this case, the separate member 310a and the display area inorganic layer 310 may be concurrently (e.g., simultaneously) formed.

The peripheral area PA may be disposed adjacent to an edge of the substrate 301. In an embodiment, the peripheral area PA may be disposed adjacent to all edges of the substrate 301.

The encapsulation inorganic layer 320 covers the display area DA on the substrate 301 and is formed on the display area inorganic layer 310. For example, the encapsulation inorganic layer 320 is formed so as to cover the display device that is arranged in the display area DA. By covering the display area DA, in more detail, by covering the display device, the encapsulation inorganic layer 320 may block or substantially block, or may decrease penetration of foreign substances such as moisture or oxygen into the display area DA.

The encapsulation inorganic layer 320 is formed on the display area inorganic layer 310. Also, at least one edge of the encapsulation inorganic layer 320 extends further than an edge of the display area inorganic layer 310. That is, the at least one edge of the encapsulation inorganic layer 320 may exceed (e.g., extend beyond or further than) the edge of the display area inorganic layer 310 and thus may contact the top surface of the substrate 301.

In an embodiment, all edges of the encapsulation inorganic layer 320 may exceed (e.g., extend beyond or further than) respective edges of the display area inorganic layer 310 and thus may contact the top surface of the substrate 301.

In more detail, the encapsulation inorganic layer 320 includes a main area 320a and a shadow area 320b. That is, when the encapsulation inorganic layer 320 is formed, e.g., when the encapsulation inorganic layer 120 is formed by deposition using a mask (not shown), the shadow area 320b may be formed via a space between the mask and the substrate 301.

The shadow area 320b is disposed between the display area inorganic layer 310 and the separate member 310a. The shadow area 320b does not extend over the separate member 310a. That is, as illustrated in FIG. 25, the shadow area 320b may contact a side surface of the separate member 310a, but in another embodiment, the shadow area 320b may be separate from (or spaced from) the side surface of the separate member 310a.

The encapsulation inorganic layer 320 may be formed of one or more of various suitable inorganic materials.

In an embodiment, the encapsulation inorganic layer 320 may include oxide, nitride, and/or oxynitride. In more detail, the encapsulation inorganic layer 320 may include silicon nitride ($SiN_x$), silicon oxide ($SiO_2$), and/or silicon oxynitride ($SiO_xN_y$).

Since an edge area of the encapsulation inorganic layer 320, i.e., the shadow area 320b, may contact the top surface of the substrate 301 and may also contact the side surface of the display area inorganic layer 310, it is possible to prevent or substantially prevent deterioration and/or elimination of an encapsulation characteristic of the encapsulation inorganic layer 320 caused by the edge of the encapsulation inorganic layer 320 being delaminated from the display area inorganic layer 310.

By doing so, the display apparatus 3000 having flexibility such as bending or folding for an increase in user convenience may be easily embodied.

Also, since at least one edge of the substrate 301 is separate from (or spaced from) the edge of the encapsulation inorganic layer 320, a portion of the top surface of the substrate 301 is not covered but is exposed in the peripheral area PA that is adjacent to the edge of the substrate 301. The exposed area of the substrate 301 completely prevents or substantially prevents propagation of cracks that occur during a cutting process for separation in the manufacture of the display apparatus 3000. Also, the flexibility of the display apparatus 3000 is improved so that user convenience may be increased.

FIGS. 26 through 28 illustrate modified examples of the display apparatus 3000 of FIG. 25.

Referring to FIG. 26, a barrier layer 302 is formed on the substrate 301. The barrier layer 302 is disposed between the substrate 301 and the display area inorganic layer 310. The barrier layer 302 may be formed of one or more of various suitable inorganic materials. For example, the barrier layer 302 may include oxide, nitride, and/or oxynitride. In more detail, the barrier layer 302 may include silicon nitride ($SiN_x$), silicon oxide ($SiO_2$), and/or silicon oxynitride ($SiO_xN_y$).

The separate member 310a is formed on the barrier layer 302.

The encapsulation inorganic layer 320 is formed on the display area inorganic layer 310. Also, the shadow area 320b of the encapsulation inorganic layer 320 is disposed between the display area inorganic layer 310 and the separate member 310a. The shadow area 320b may contact a top surface of the barrier layer 302.

The shadow area 320b does not extend over the separate member 310a.

The barrier layer 302 may block or substantially block foreign substances such as moisture or oxygen that penetrates via the substrate 301.

Referring to FIG. 27, a separate member 302a is formed on the substrate 301 and is separate from (or spaced from) the barrier layer 302.

In an embodiment, the separate member 302a may be formed of the same material as the barrier layer 302, and in this case, the separate member 302a and the barrier layer 302 may be concurrently (e.g., simultaneously) formed.

The encapsulation inorganic layer 320 is formed on the display area inorganic layer 310. Also, the shadow area 320b of the encapsulation inorganic layer 320 does not extend over the separate member 302a. In an embodiment, the shadow area 320b may contact a side surface of the barrier layer 302 and a side surface of the display area inorganic layer 310.

Referring to FIG. 27, the shadow area 320b is separate from (or spaced from) the separate member 302a, but in another embodiment, the shadow area 320b may contact a side surface of the separate member 302a.

Also, as illustrated in FIG. 28, a separate member having multiple layers, i.e., a first separate member 302a and a second separate member 310a, may be formed on the substrate 301.

Although not illustrated in FIGS. 25 through 28, a structure of the aforementioned embodiment including an encapsulation organic layer, a blocking member, or the like, i.e., a structure of the encapsulation organic layer, the functional layer, and the blocking member that are shown in FIGS. 5 through 11 may be applied to the embodiments of FIGS. 25 through 28.

Figure 29:
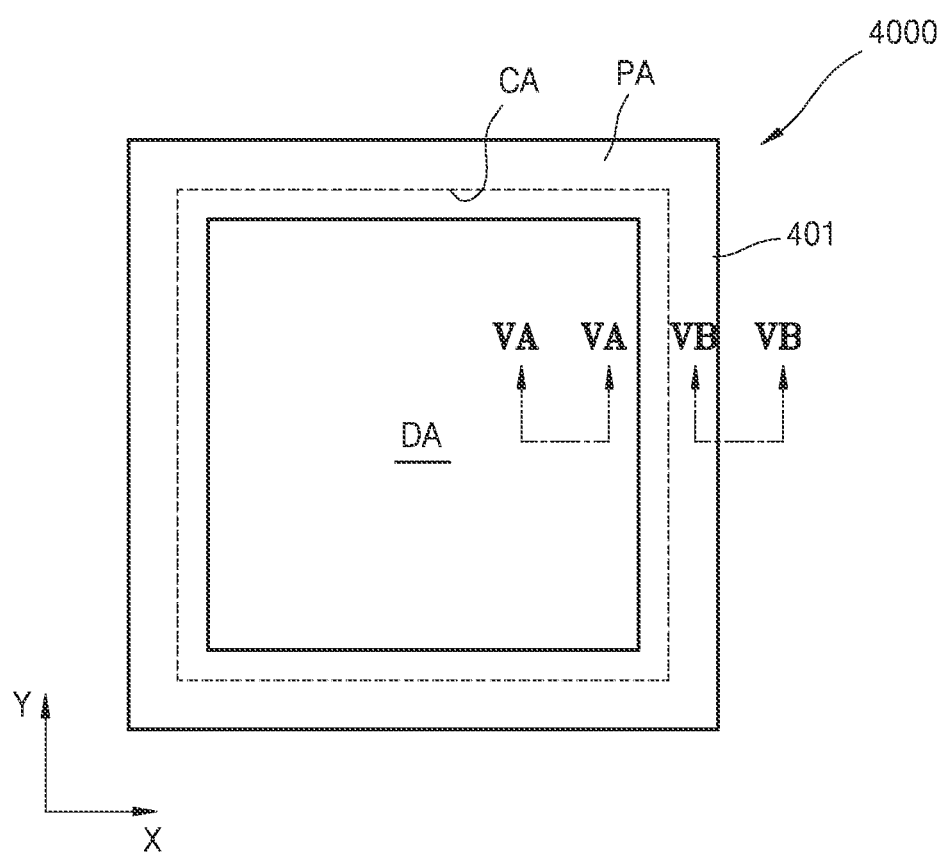
FIG. 29 illustrates a plan view of a display apparatus according to another embodiment of the present invention.
Figure 30:
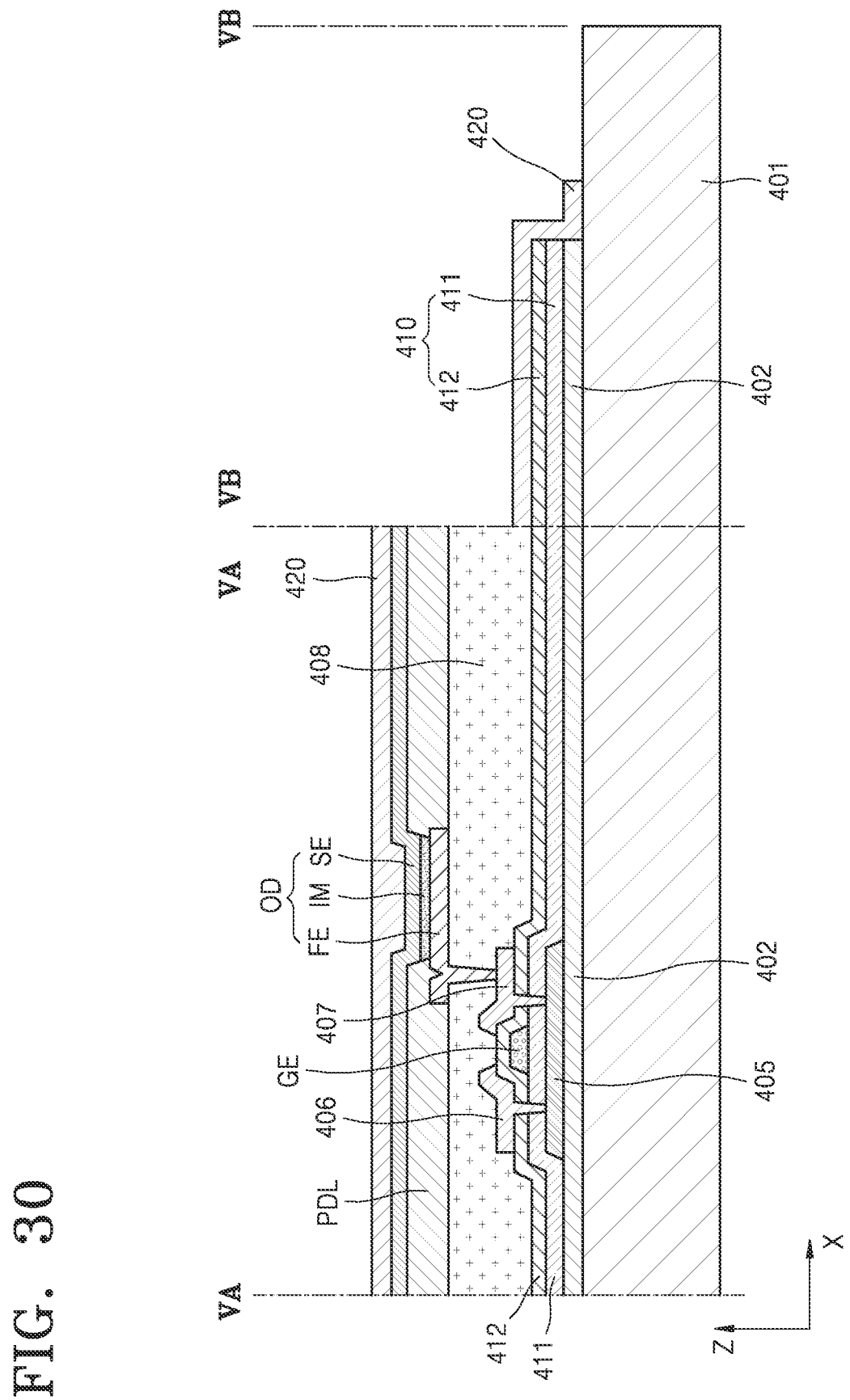
FIG. 30 is a cross-sectional view of the display apparatus, taken along the lines VA-VA and VB-VB of FIG. 29.

FIG. 29 illustrates a plan view of a display apparatus 4000, according to another embodiment of the present invention. FIG. 30 is a cross-sectional view of the display apparatus 4000, taken along the lines VA-VA and VB-VB of FIG. 29.

Referring to FIGS. 29 and 30, the display apparatus 4000 includes a substrate 401. A central area CA having a display area DA, and a peripheral area PA disposed around the central area CA are defined on the substrate 401.

A display area inorganic layer 410 and an encapsulation inorganic layer 420 are formed on the substrate 401.

Each of the components/structures is described in detail.

The substrate 401 may include one or more of various suitable materials. In more detail, the substrate 401 may be formed of a glass material, a metal material, one or more of suitable organic materials, and/or other suitable materials.

In an embodiment, the substrate 401 may be a flexible substrate 401. Here, the flexible substrate 401 indicates a substrate having flexibility that is adapted to be bent, curved, folded, and/or rolled (e.g., with relative ease). The flexible substrate 401 may be formed of ultra-thin glass, metal, and/or plastic. For example, when plastic is used, the substrate 401 may be formed of polyimide (PI) but one or more embodiments are not limited thereto and thus one or more of various suitable materials may be used.

The display apparatus 4000 may be formed in various ways. For example, a process may be performed on a mother substrate so as to make the mother substrate include a plurality of the display apparatuses 4000, and then a cutting process may be performed so that the plurality of the display apparatuses 4000 may be formed. In an embodiment, one display apparatus 4000 may be formed on one mother substrate.

The substrate 401 is partitioned into the peripheral area PA and the central area CA. In more detail, the peripheral area PA indicates an area adjacent to edges of the substrate 401, and the central area CA indicates an area that is inwardly positioned, compared to the peripheral area PA.

The central area CA may include at least one display area DA.

In order to display an image, at least one display device OD may be disposed in the display area DA. The display device OD may include various types of a device, e.g., may be an OLED.

Also, a plurality of pixels may be disposed in the display area DA, and the at least one display device OD may be disposed in each of the plurality of pixels.

A non-display area (not shown) may be formed around the display area DA. In more detail, the non-display area may be formed surrounding the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not shown) may be formed in the non-display area. In this regard, a driver or a plurality of pad units (not shown) may be disposed in the pad area.

A barrier layer 402 is formed on the substrate 401. The barrier layer 402 is formed on the display area DA and extends to the peripheral area PA. In an embodiment, the barrier layer 402 may be omitted.

A thin film transistor (TFT) may be formed on the display area DA on the barrier layer 402. The TFT that is formed on the display area DA functions as a part of a circuit for driving the display device OD. The TFT may also be formed on the non-display area.

Hereinafter, it is assumed that the TFT is a top gate type TFT in which an active layer 405, a gate electrode GE, a source electrode 406, and a drain electrode 407 are sequentially formed.

However, the present embodiment is not limited thereto, and various types of a TFT including a bottom gate type TFT, may be used as the TFT.

The active layer 405 is formed on the barrier layer 402. The active layer 405 may include a semiconductor material, e.g., amorphous silicon or polycrystalline silicon. However, the present embodiment is not limited thereto, and the active layer 405 may include one or more of various suitable materials. In an embodiment, the active layer 405 may include an organic semiconductor material.

In another embodiment, the active layer 405 may include an oxide semiconductor material. For example, the active layer 405 may include oxide including a material selected from metal elements of groups 12, 13, and 14 consisting of zinc (Zn), indium (In), gallium (Ga), tin (Sn), cadmium (Cd), germanium (Ge), and hafnium (Hf), and a composition thereof.

A gate insulating layer 411 is formed on the active layer 405. The gate insulating layer 411 may be formed as multiple layers or a single layer including an inorganic material such as silicon oxide and/or silicon nitride. The gate insulating layer 411 insulates the active layer 405 from the gate electrode GE.

In an embodiment, the gate insulating layer 411 as the display area inorganic layer 410 may be formed not only on the display area DA but may also extend to a portion of the peripheral area PA.

The gate electrode GE is formed on the gate insulating layer 411. The gate electrode GE may be connected to a gate line (not shown) that applies an ON signal or an OFF signal to the TFT.

The gate electrode GE may be formed of a low resistance metal material. For example, the gate electrode GE may be formed as multiple layers or a single layer including a conductive material including molybdenum (Mo), aluminum (Al), copper (Cu), and/or Titanium (Ti).

An interlayer insulating layer 412 is formed on the gate electrode GE. The interlayer insulating layer 412 insulates the gate electrode GE from the source electrode 406 and the drain electrode 407.

In an embodiment, the interlayer insulating layer 412 as the display area inorganic layer 410 may be formed not only on the display area DA but may also extend to a portion of the peripheral area PA.

That is, the gate insulating layer 411 and the interlayer insulating layer 412 may be formed as the display area inorganic layer 410 on the barrier layer 402 in the peripheral area PA.

The interlayer insulating layer 412 may be formed as multiple layers or a single layer including an inorganic material. For example, the inorganic material may be metal oxide or metal nitride, in more detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zirconium oxide ($ZrO_2$).

The source electrode 406 and the drain electrode 407 are formed on the interlayer insulating layer 412. Each of the source electrode 406 and the drain electrode 407 may be formed as a single layer or multiple layers including a highly conductive material.

The source electrode 406 and the drain electrode 407 are formed so as to contact the active layer 405.

A passivation layer 408 is formed on the source electrode 406 and the drain electrode 407 so as to cover the TFT.

The passivation layer 408 removes a step caused by the TFT, provides a planarized layer over the TFT, and thus prevents or substantially prevents a defect from occurring in the display device OD such as an OLED due to unevenness due to the TFT. The passivation layer 408 may be formed as a single layer or multiple layers including an organic material. The organic material may include polymer derivatives having commercial polymers such as Polymethylmethacrylate (PMMA) or Polystyrene (PS), and a phenol group, an acryl-based polymer, an imide-based polymer, an arylene ether-based polymer, an amide-based polymer, a fluorine-based polymer, a p-xylene-based polymer, a vinylalcohol-based polymer, or a combination thereof. Also, the passivation layer 408 may be formed as a multi-stack including an inorganic insulating layer and an organic insulating layer.

The display device OD is formed on the passivation layer 408. The display device OD is electrically connected to the TFT.

The display device OD includes a first electrode FE, a second electrode SE, and an intermediate layer IM disposed between the first electrode FE and the second electrode SE.

The first electrode FE is electrically connected to one of the source electrode 406 and the drain electrode 407. Referring to FIG. 30, the first electrode FE may be electrically connected to the drain electrode 407.

The first electrode FE may have one of various suitable forms. For example, the first electrode FE may be patterned as an island form.

The first electrode FE may be formed of one or more of various suitable materials. That is, the first electrode FE may include at least one selected from the group of transparent conductive oxide materials including indium tin oxide (ITO), indium zinc oxide (IZO), zinc oxide (ZnO), indium oxide ($In_2O_3$), indium gallium oxide (IGO), and aluminum zinc oxide (AZO). Also, the first electrode FE may include metal such as silver (Ag) having high reflectance.

The intermediate layer IM may include an organic emission layer including a small molecular organic material or a polymer molecular organic material. In an embodiment, the intermediate layer IM includes the organic emission layer and may further include one or more layers selected from a hole injection layer, a hole transport layer, an electron transport layer, and an electron injection layer.

The organic emission layer may be formed in each of OLEDs. In this case, the OLEDs may emit red light, green light, and blue light, respectively. However, one or more embodiments of the present invention are not limited thereto, and the organic emission layer may be commonly formed in the OLEDs. For example, a plurality of organic emission layers that emit red light, green light, and blue light may be vertically stacked or mixed and thus may emit white light. Those skilled in the art would know that color combination for emitting white light is not limited to the aforementioned description. In this case, a color conversion layer or a color filter may be separately arranged to convert the emitted white light to a predetermined color.

The second electrode SE may be formed of one or more of various suitable conductive materials. For example, the second electrode SE may be formed as multiple layers or a single layer including at least one of lithium (Li), calcium (Ca), lithium fluoride (LiF), aluminum (Al), magnesium (Mg), silver (Ag), and an alloy including at least two of these materials.

A pixel-defining layer PDL is formed on the passivation layer 408. In more detail, after the pixel-defining layer PDL is formed while not covering an area (e.g., a predetermined area) of the first electrode FE, the intermediate layer IM is formed on the area of the first electrode FE that is not covered by the pixel-defining layer PDL, and the second electrode SE is formed on the intermediate layer IM.

The pixel-defining layer PDL may be formed of at least one inorganic insulating material selected from polyimide, polyamide, an acryl resin, benzocyclobutene, and a phenol resin by using a spin coating method.

Although not illustrated on the second electrode SE, in an embodiment, a functional layer (not shown) and a first protective layer (not shown) as those of FIG. 11 may be further formed thereon.

The features of the functional layer and the first protective layer are the same or substantially the same as described above, thus, detailed descriptions thereof are omitted here.

The gate insulating layer 411 and the interlayer insulating layer 412 as the display area inorganic layer 410 may be formed of one or more of various suitable inorganic materials.

In an embodiment, the display area inorganic layer 410 may include oxide, nitride, and/or oxynitride. In more detail, the display area inorganic layer 410 may include silicon nitride ($SiN_x$), silicon oxide ($SiO_2$), and/or silicon oxynitride ($SiO_xN_y$).

The peripheral area PA may be disposed adjacent to an edge of the substrate 401. In an embodiment, the peripheral area PA may be disposed adjacent to all edges of the substrate 401.

The encapsulation inorganic layer 420 covers the display area DA on the substrate 401. That is, the encapsulation inorganic layer 420 is formed on the second electrode SE of the display device OD. The encapsulation inorganic layer 420 may cover the display area DA, e.g., the display device OD, and thus may block or substantially block, or may decrease penetration of foreign substances such as moisture or oxygen into the display area DA.

In the peripheral area PA, the encapsulation inorganic layer 420 is formed on the display area inorganic layer 410. Also, at least one edge of the encapsulation inorganic layer 420 extends over an edge of the display area inorganic layer 410. That is, the at least one edge of the encapsulation inorganic layer 420 may exceed (e.g., extend beyond or further than) the edge of the display area inorganic layer 410 and then may contact a top surface of the substrate 401.

In an embodiment, all edges of the encapsulation inorganic layer 420 may exceed (e.g., extend beyond or further than) respective edges of the display area inorganic layer 410 and then may contact the top surface of the substrate 401.

The encapsulation inorganic layer 420 may be formed of one or more of various suitable inorganic materials.

In an embodiment, the encapsulation inorganic layer 420 may include oxide, nitride, and/or oxynitride. In more detail, the encapsulation inorganic layer 420 may include silicon nitride ($SiN_x$), silicon oxide ($SiO_2$), and/or silicon oxynitride ($SiO_xN_y$).

Although not illustrated, in an embodiment, the encapsulation inorganic layer 420 may include a main area (not shown) and a shadow area (not shown). That is, a structure of FIG. 3 may be applied to the present embodiment.

Also, in an embodiment, all edges of the encapsulation inorganic layer 420 may exceed (e.g., extend beyond or further than) respective edges of the display area inorganic layer 410 and then may be formed on the top surface of the substrate 401.

That is, since an edge area of the encapsulation inorganic layer 420 contacts the top surface of the substrate 401, it is possible to prevent or substantially prevent the edge of the encapsulation inorganic layer 420 from being delaminated from the display area inorganic layer 410, so that an encapsulation characteristic of the encapsulation inorganic layer 420 may be improved.

In an embodiment, when the substrate 401 is formed of an organic material such as plastic, the encapsulation inorganic layer 420 contacts the top surface of the substrate 401, so that it is possible to efficiently decrease or prevent delamination of the encapsulation inorganic layer 420 from the substrate 401 while the display apparatus 4000 is manufactured or is used. For example, when a high temperature process or a high moisture process is performed during the manufacture of the display apparatus 4000, the encapsulation inorganic layer 420 may contract and expand such that a stress may occur in the encapsulation inorganic layer 420. Here, the substrate 401 including the organic material may relieve the stress of the encapsulation inorganic layer 420.

By doing so, the display apparatus 4000 having flexibility such as bending or folding for an increase in user convenience may be easily embodied.

Also, since at least one edge of the substrate 401 is separate from (or spaced from) the edge of the encapsulation inorganic layer 420, a portion of the top surface of the substrate 401 is not covered but is exposed in the peripheral area PA that is adjacent to the edge of the substrate 401. The exposed area of the substrate 401 completely prevents or substantially prevents propagation of cracks that occur during a cutting process for separation in the manufacture of the display apparatus 4000. Also, the flexibility of the display apparatus 4000 is improved so that user convenience may be increased.

Although not illustrated, the embodiments of FIGS. 5 through 11 may be selectively applied to the present embodiment.

That is, as illustrated in FIG. 5, an encapsulation organic layer (not shown) may be formed on the display device OD on the display area DA and may extend lengthwise and thus may be disposed between the display area inorganic layer 410 and the encapsulation inorganic layer 420 in the peripheral area PA.

Also, the present embodiment may further include a blocking member (not shown) of FIG. 6 or a plurality of blocking members (not shown) of FIG. 7.

Also, as illustrated in FIG. 8, the encapsulation inorganic layer 420 may include a plurality of inorganic layers.

Also, as illustrated in FIG. 9, the encapsulation inorganic layer 420 may include a plurality of inorganic layers, an encapsulation organic layer (not shown) may be disposed between the plurality of inorganic layers that are adjacent to each other, and a blocking member (not shown) may be formed on the display area inorganic layer 410 so as to prevent or reduce an overflow of a material of the encapsulation organic layer.

Also, as illustrated in FIG. 10, the encapsulation inorganic layer 420 may include a plurality of inorganic layers (not shown) and may further include an encapsulation organic layer (not shown). At least one blocking member (not shown) may block or reduce an overflow of a material of the encapsulation organic layer.

Also, as illustrated in FIG. 11, the display apparatus 4000 may further include a functional layer (not shown), a first protective layer (not shown), and a second protective layer (not shown).

Also, structures of the embodiments of FIGS. 12 through 28 may be selectively applied to the present embodiment, so that a structure in which at least one edge of the encapsulation inorganic layer 420 is formed in parallel with at least one edge of the display area inorganic layer 410, a structure in which the encapsulation inorganic layer 420 includes a main area and a shadow area, and/or a structure in which a separate member is further included, is available.

Figure 31:
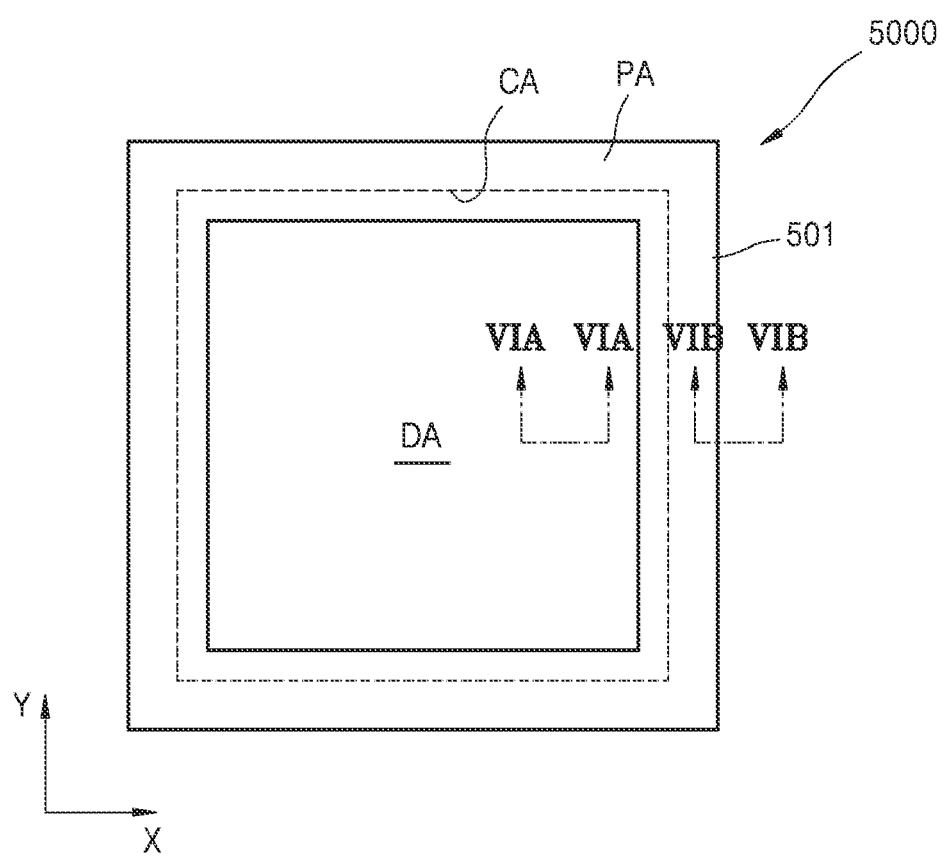
FIG. 31 illustrates a plan view of a display apparatus according to another embodiment of the present invention.
Figure 32:
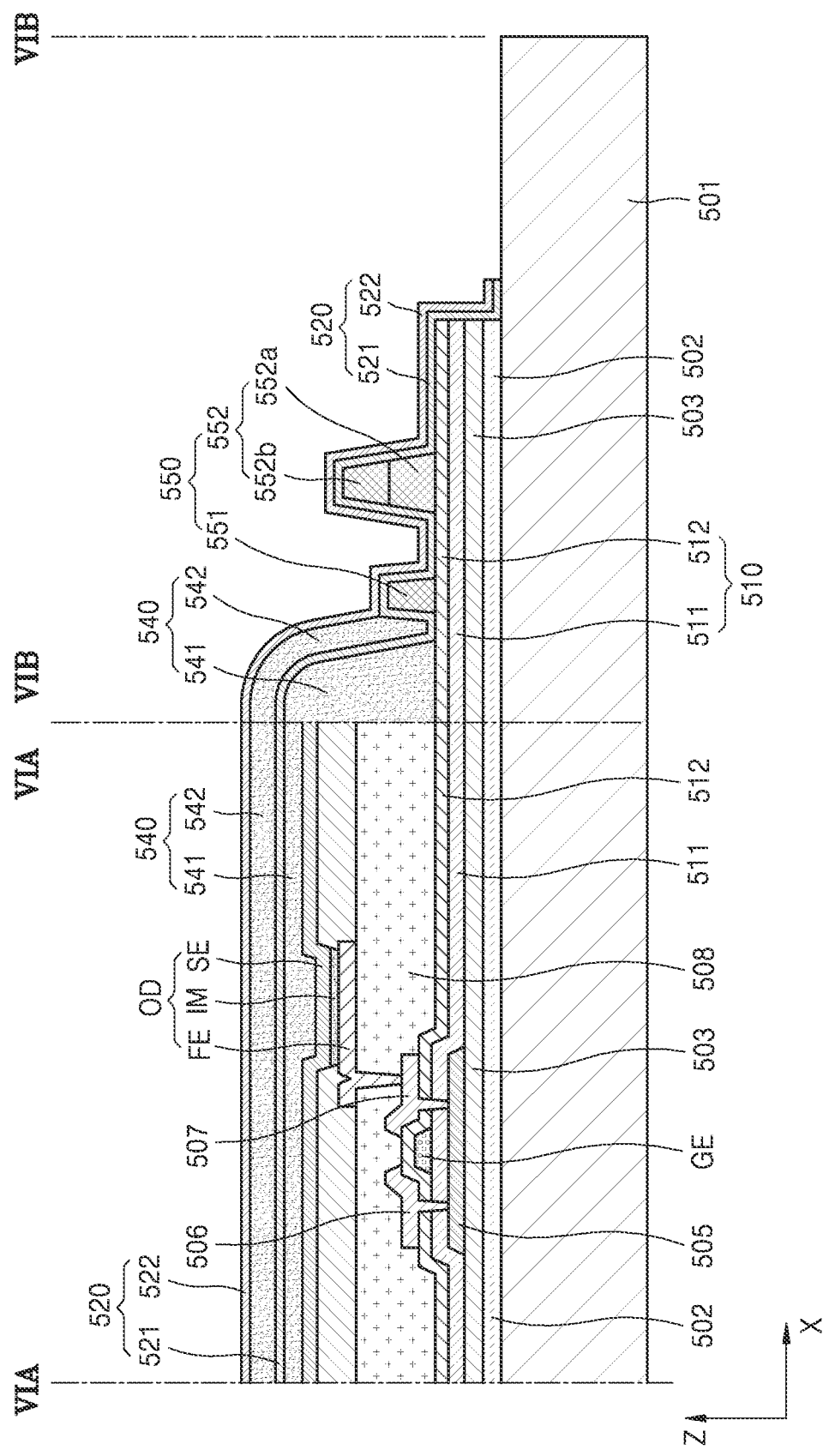
FIG. 32 is a cross-sectional view of the display apparatus, taken along the lines VI-VIA and VI-VIB of FIG. 31.

FIG. 31 illustrates a plan view of a display apparatus 5000, according to another embodiment of the present invention. FIG. 32 is a cross-sectional view of the display apparatus 5000, taken along the lines VI-VIA and VI-VIB of FIG. 31.

Referring to FIGS. 31 and 32, the display apparatus 5000 includes a substrate 501. A central area CA having a display area DA, and a peripheral area PA disposed around the central area CA are defined on the substrate 501.

Compared to the display apparatus 4000 of the previous embodiment, the display apparatus 5000 of the present embodiment is different in a structure of a buffer layer 503, an encapsulation inorganic layer 520, an encapsulation organic layer 540, and a blocking member 550. For convenience of description, differences therebetween are mainly described.

A barrier layer 502 is formed on the substrate 501. The buffer layer 503 is formed on the barrier layer 502. The buffer layer 503 may provide a planar surface on the substrate 501 and may primarily block or substantially block foreign substances or moisture that penetrates via the substrate 501. Since the buffer layer 503 is not an essential element, the buffer layer 503 may not be arranged.

A TFT may be formed on the display area DA on the buffer layer 503. The TFT that is formed on the display area DA functions as a part of a circuit for driving the display device OD. The TFT may also be formed on a non-display area.

The TFT includes an active layer 505, a gate electrode GE, a source electrode 506, and a drain electrode 507.

The active layer 505 is formed on the buffer layer 503. A gate insulating layer 511 is formed on the active layer 505. In an embodiment, the gate insulating layer 511 as a layer of the display area inorganic layer 510 may be formed not only on the display area DA but may also extend to a portion of the peripheral area PA.

The gate electrode GE is formed on the gate insulating layer 511. An interlayer insulating layer 512 is formed on the gate electrode GE and insulates the source electrode 506 and the drain electrode 507 from the gate electrode GE.

In an embodiment, the interlayer insulating layer 512 as a layer of the display area inorganic layer 510 may be formed not only on the display area DA but may also extend to a portion of the peripheral area PA.

That is, the gate insulating layer 511 and the interlayer insulating layer 512 may be formed as the display area inorganic layer 510 on the barrier layer 502 in the peripheral area PA.

The source electrode 506 and the drain electrode 507 are formed on the interlayer insulating layer 512. Each of the source electrode 506 and the drain electrode 507 may be formed as a single layer or multiple layers including a highly conductive material.

The source electrode 506 and the drain electrode 507 are formed so as to contact the active layer 505.

A passivation layer 508 is formed on the source electrode 506 and the drain electrode 507 so as to cover the TFT.

The display device OD is formed on the passivation layer 508. The display device OD is electrically connected to the TFT.

The display device OD includes a first electrode FE, a second electrode SE, and an intermediate layer IM disposed between the first electrode FE and the second electrode SE.

A pixel-defining layer (PDL) is formed on the passivation layer 508. In more detail, after the pixel-defining layer is formed while not covering an area (e.g., a predetermined area) of the first electrode FE, the intermediate layer IM is formed on the area of the first electrode FE that is not covered by the pixel-defining layer, and the second electrode SE is formed on the intermediate layer IM.

Although not illustrated on the second electrode SE, in an embodiment, a functional layer (not shown) and a first protective layer (not shown) of FIG. 11 may be further formed. The features of the functional layer and the first protective layer are the same or substantially the same as described above, thus, detailed descriptions thereof are omitted here.

The gate insulating layer 511 and the interlayer insulating layer 512 of the display area inorganic layer 510 may be formed of one or more of various suitable inorganic materials.

The encapsulation inorganic layer 520 covers the display area DA on the substrate 501. The encapsulation inorganic layer 520 includes a first inorganic layer 521 and a second inorganic layer 522.

The encapsulation organic layer 540 includes a plurality of organic layers, i.e., a first organic layer 541 and a second organic layer 542.

The first organic layer 541 is disposed between the first inorganic layer 521 and the second electrode SE of the display device OD, and the second organic layer 542 is disposed between the first inorganic layer 521 and the second inorganic layer 522.

In an embodiment, the second organic layer 542 may be formed so as to be larger than the first organic layer 541.

The blocking member 550 is formed on the interlayer insulating layer 512 of the display area inorganic layer 510 and includes a first blocking member 551 and a second blocking member 552. The first blocking member 551 and the second blocking member 552 may prevent or substantially prevent an overflow of materials of the first organic layer 541 and the second organic layer 542.

The second blocking member 552 includes a first layer 552a and a second layer 552b.

The blocking member 550 may be formed of one or more of various suitable materials. In the present embodiment, the first blocking member 551 and the first layer 552a of the second blocking member 552 may be formed of the same material, e.g., a material of the passivation layer 508.

The second layer 552b of the second blocking member 552 may be formed of the pixel-defining layer.

At least one edge of the encapsulation inorganic layer 520 extends over an edge of the display area inorganic layer 510. That is, the at least one edge of the encapsulation inorganic layer 520 may exceed (e.g., extend beyond or further than) the edge of the display area inorganic layer 510 and then may contact a top surface of the substrate 501.

In an embodiment, all edges of the encapsulation inorganic layer 520 may exceed (e.g., extend beyond or further than) respective edges of the display area inorganic layer 510 and then may contact the top surface of the substrate 501.

The encapsulation inorganic layer 520 may be formed of one or more of various suitable inorganic materials.

In an embodiment, the encapsulation inorganic layer 520 may include oxide, nitride, and/or oxynitride. In more detail, the encapsulation inorganic layer 520 may include silicon nitride ($SiN_x$), silicon oxide ($SiO_2$), and/or silicon oxynitride ($SiO_xN_y$).

Although not illustrated, the encapsulation inorganic layer 520 may include a main area (not shown) and a shadow area (not shown). That is, a structure of FIG. 3 may be applied to the present embodiment.

Also, all edges of the encapsulation inorganic layer 520 may exceed respective edges of the display area inorganic layer 510 and then may be formed on the top surface of the substrate 501.

Although not illustrated, structures of the embodiments of FIGS. 12 through 28 may be selectively applied to the present embodiment, so that a structure in which at least one edge of the encapsulation inorganic layer 520 is formed in parallel with at least one edge of the display area inorganic layer 510, a structure in which the encapsulation inorganic layer 520 includes a main area and a shadow area, and/or a structure in which a separate member is further included, is available.

Figure 33:
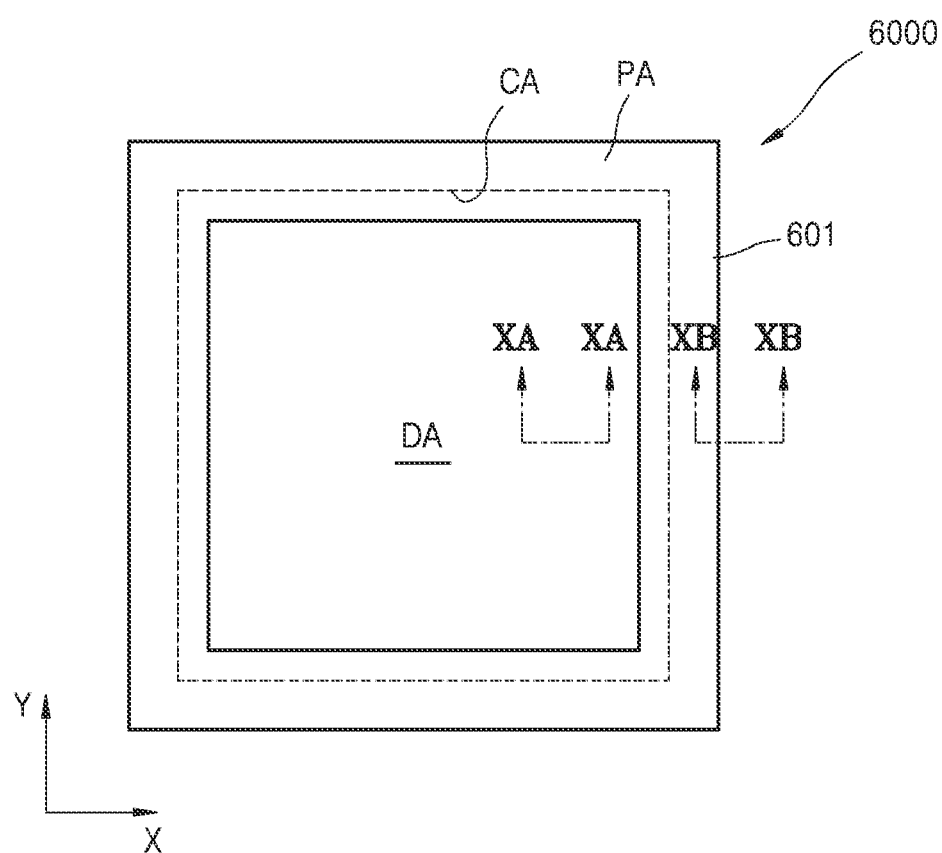
FIG. 33 illustrates a plan view of a display apparatus according to another embodiment of the present invention.
Figure 34:
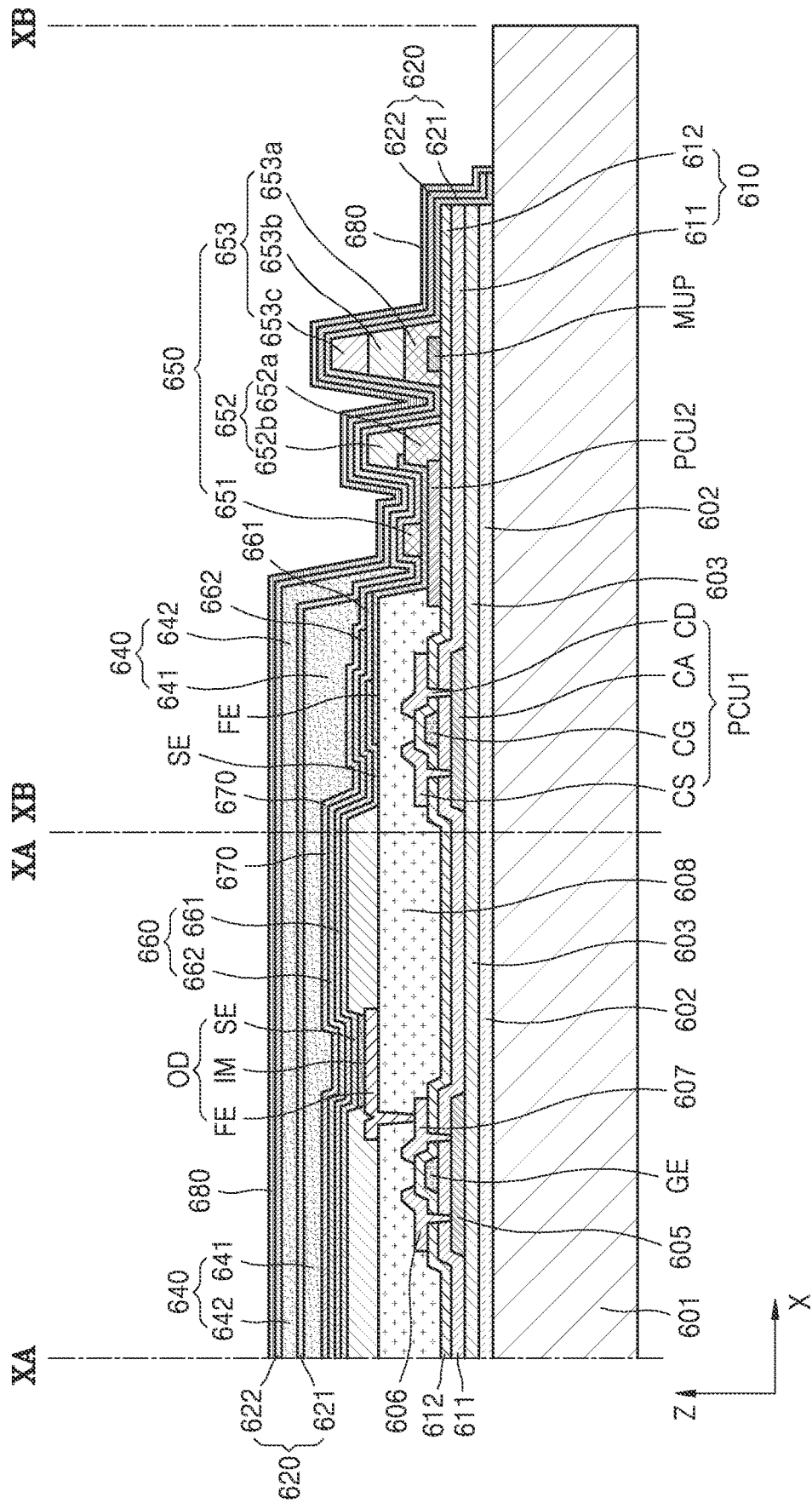
FIG. 34 is a cross-sectional view of the display apparatus, taken along the lines XA-XA and XB-XB of FIG. 33.

FIG. 33 illustrates a plan view of a display apparatus 6000, according to another embodiment of the present invention. FIG. 34 is a cross-sectional view of the display apparatus 6000, taken along the lines XA-XA and XB-XB of FIG. 33.

Referring to FIGS. 33 and 34, the display apparatus 6000 includes a substrate 601. A central area CA having a display area DA, and a peripheral area PA disposed around the central area CA are defined on the substrate 601.

For convenience of description, differences between the present embodiment and the previous embodiments are mainly described.

A barrier layer 602 is formed on the substrate 601. A buffer layer 603 is formed on the barrier layer 602. Since the buffer layer 603 is not an essential element, the buffer layer 603 may not be arranged.

A TFT may be formed on the display area DA on the buffer layer 603. The TFT that is formed on the display area DA functions as a part of a circuit for driving the display device OD. The TFT may also be formed on a non-display area.

The TFT includes an active layer 605, a gate electrode GE, a source electrode 606, and a drain electrode 607.

A first circuit member PCU1 may be formed in the peripheral area PA or the non-display area. The first circuit member PCU1 may have one or more of various suitable forms and may include a circuit active layer CA, a circuit gate electrode CG, a circuit source electrode CS, and a circuit drain electrode CD.

The first circuit member PCU1 may transfer an electric signal for driving the display device OD to the display device OD or may convert the electric signal.

The active layer 605 and the circuit active layer CA are formed on the buffer layer 603. A gate insulating layer 611 is formed on the active layer 605 and the circuit active layer CA.

The gate electrode GE is formed on the gate insulating layer 611. Also, the circuit gate electrode CG is formed on the gate insulating layer 611.

An interlayer insulating layer 612 is formed on the gate electrode GE and the circuit gate electrode CG. In the present embodiment, the interlayer insulating layer 612 as a layer of the display area inorganic layer 610 may be formed on the display area DA and may extend to a portion of the peripheral area PA.

That is, the gate insulating layer 611 and the interlayer insulating layer 612 may be formed as the display area inorganic layer 610 on the barrier layer 602 in the peripheral area PA. Also, the buffer layer 603 may extend to the barrier layer 602.

The source electrode 606 and the drain electrode 607 are formed on the interlayer insulating layer 612. Also, the circuit source electrode CS and the drain electrode 607 are formed on the interlayer insulating layer 612.

In the present embodiment, a second circuit member PCU2 may be disposed on the interlayer insulating layer 612. The second circuit member PCU2 may transfer an electric signal for driving the display device OD to the display device OD or may convert the electric signal.

A passivation layer 608 may be formed on the source electrode 606 and the drain electrode 607 so as to cover the TFT. Also, the passivation layer 608 may cover the first circuit member PCU1.

The display device OD is formed on the passivation layer 608. The display device OD is electrically connected to the TFT. That is, as illustrated in FIG. 34, the display device OD may be electrically connected to the drain electrode 607.

The display device OD includes a first electrode FE, a second electrode SE, and an intermediate layer IM disposed between the first electrode FE and the second electrode SE.

A pixel-defining layer (PDL) is formed on the passivation layer 608. In more detail, after the pixel-defining layer is formed while not covering an area (e.g., a predetermined area) of the first electrode FE, the intermediate layer IM is formed on the area of the first electrode FE that is not covered by the pixel-defining layer, and the second electrode SE is formed on the intermediate layer IM.

Although not illustrated on the second electrode SE, in an embodiment, a functional layer (not shown) and a first protective layer (not shown) of FIG. 11 may be further formed. The features of the functional layer and the first protective layer are the same or substantially the same as described above, thus, detailed descriptions thereof are omitted here.

The gate insulating layer 611 and the interlayer insulating layer 612 of the display area inorganic layer 610 may be formed of one or more of various suitable inorganic materials.

The encapsulation inorganic layer 620 is formed so as to cover the display area DA on the substrate 601. The encapsulation inorganic layer 620 includes a first inorganic layer 621 and a second inorganic layer 622.

A functional layer 660 is formed on the display device OD. The functional layer 660 may include a capping layer 661 and a cover layer 662. The capping layer 661 may protect the second electrode SE that is a top layer of the display device OD arranged in the display area DA, may control a refractive index of a visible ray realized by the display device OD, and thus may improve luminescent efficiency of the display apparatus 6000. Also, the cover layer 662 may be formed on the capping layer 661, may protect the capping layer 661 and the display device OD, may control a refractive index of a visible ray realized by the display device OD, and thus may improve luminescent efficiency of the display apparatus 6000. The cover layer 662 may include lithium fluoride (e.g., LiF).

The capping layer 661 may be formed larger than the display device OD so as to cover the display device OD. In the present embodiment, the cover layer 662 may be smaller than the capping layer 661.

The first protective layer 670 may be formed on the functional layer 660 and may include an inorganic material, e.g., oxide and/or nitride. In the present embodiment, the first protective layer 670 may include aluminum oxide, e.g., $Al_2O_3$.

The first protective layer 670 may be formed larger than the functional layer 660 and may be formed smaller than a first organic layer 641. In an embodiment, the first protective layer 670 may be formed larger than the first organic layer 641 and the second organic layer 642.

The encapsulation organic layer 640 includes a plurality of organic layers, i.e., the first organic layer 641 and the second organic layer 642.

The first organic layer 641 is disposed between the first protective layer 670 and the first inorganic layer 621 in the display area DA, and the second organic layer 642 is disposed between the first inorganic layer 621 and the second inorganic layer 622.

The second organic layer 642 may be formed larger than the first organic layer 641.

A blocking member 650 is formed on the interlayer insulating layer 612 of the display area inorganic layer 610 and includes a first blocking member 651, a second blocking member 652, and a third blocking member 653. The first blocking member 651, the second blocking member 652, and the third blocking member 653 may block or substantially block an overflow of materials of the first organic layer 641 and the second organic layer 642.

The second blocking member 652 includes a first layer 652a and a second layer 652b. The third blocking member 653 includes a first layer 652a, a second layer 652b, and a third layer 652c.

The blocking member 650 may be formed of one or more of various suitable materials. In the present embodiment, the first blocking member 651 may be formed of the same material as the passivation layer 608 or the pixel-defining layer. Also, the first layer 652a and the second layer 652b of the second blocking member 652 may be formed of the same material as the passivation layer 608 and the pixel-defining layer.

Also, each of the first layer 652a, the second layer 652b, and the third layer 652c of the third blocking member 653 may be formed of the same material as at least one selected from the passivation layer 608 and the pixel-defining layer.

A conductive member MUP may be disposed below the first layer 653a of the third blocking member 653.

At least one edge of the encapsulation inorganic layer 620 extends over an edge of the display area inorganic layer 610. That is, the at least one edge of the encapsulation inorganic layer 620 may exceed (e.g., may extend further than or beyond) the edge of the display area inorganic layer 610 and then may contact a top surface of the substrate 601.

In an embodiment, all edges of the encapsulation inorganic layer 620 may exceed (e.g., extend beyond or further than) respective edges of the display area inorganic layer 610 and then may contact the top surface of the substrate 601.

The encapsulation inorganic layer 620 may be formed of one or more of various suitable inorganic materials.

In an embodiment, the encapsulation inorganic layer 620 may include oxide, nitride, and/or oxynitride. In more detail, the encapsulation inorganic layer 620 may include silicon nitride ($SiN_x$), silicon oxide ($SiO_2$), and/or silicon oxynitride ($SiO_xN_y$).

Although not illustrated, the encapsulation inorganic layer 620 may include a main area (not shown) and a shadow area (not shown). That is, a structure of FIG. 3 may be applied to the present embodiment.

Also, all edges of the encapsulation inorganic layer 620 may exceed respective edges of the display area inorganic layer 610 and then may be formed on the top surface of the substrate 601.

Although not illustrated, structures of the embodiments of FIGS. 12 through 28 may be selectively applied to the present embodiment, so that a structure in which at least one edge of the encapsulation inorganic layer 620 is formed in parallel with at least one edge of the display area inorganic layer 610, a structure in which the encapsulation inorganic layer 620 includes a main area and a shadow area, and/or a structure in which a separate member is further included, is available.

According to the one or more of the above embodiments of the present invention, the display apparatus may have improved durability.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and their equivalents.

What is claimed is:

1. A display apparatus comprising:
a substrate having a display area and a peripheral area around the display area;
a display device on the display area;
an encapsulating layer covering the display device, and comprising a first inorganic layer and a second inorganic layer on the first inorganic layer, the first inorganic layer on the display area and extending to a portion of the peripheral area;
a blocking member disposed on the peripheral area and comprising a first blocking member and a second blocking member; and
a conductive member disposed below the second blocking member, a bottom surface of the conductive member and a bottom surface of the second blocking member being on an upper surface of a same layer,
wherein the first inorganic layer directly contacts the second inorganic layer in at least a region of the peripheral area.

2. The display apparatus of claim 1, wherein the encapsulating layer further comprises an organic layer between the first inorganic layer and the second inorganic layer.

3. The display apparatus of claim 1, wherein a distance between the second blocking member and an edge of the substrate is greater than a distance between the second inorganic layer and the edge of the substrate.

4. The display apparatus of claim 1, further comprising a third inorganic layer on the display area and disposed between the substrate and the display device,
wherein the third inorganic layer extends to the peripheral area, and
wherein the third inorganic layer directly contacts the first inorganic layer in at least a region of the peripheral area.

5. The display apparatus of claim 4, wherein an edge of the third inorganic layer is spaced from an edge of the substrate.

6. The display apparatus of claim 4, wherein an edge of the first inorganic layer extends over an edge of the third inorganic layer.

7. The display apparatus of claim 1, wherein an edge of the first inorganic layer is spaced from an edge of the substrate.

8. The display apparatus of claim 1, further comprising a protective layer on the second inorganic layer and terminating at an upper surface of the substrate in the peripheral area of the substrate,
wherein a distance between the protective layer and an edge of the substrate is less than a distance between the second inorganic layer and the edge of the substrate.

9. The display apparatus of claim 1, wherein the conductive member is at least partially buried in the second blocking member.

10. A display apparatus comprising:
a substrate having a display area and a peripheral area around the display area;
a display device on the display area;
an encapsulating layer covering the display device, and comprising a first inorganic layer and a second inorganic layer on the first inorganic layer, the first inorganic layer on the display area and extending to a portion of the peripheral area;
a blocking member disposed on the peripheral area and comprising a first blocking member and a second blocking member; and
a conductive member disposed below the second blocking member, a bottom surface of the conductive member and a bottom surface of the second blocking member being at a same layer,
wherein the first inorganic layer directly contacts the second inorganic layer in at least a region of the peripheral area,
wherein the first blocking member comprises a first layer and a second layer on the first layer, and
the second blocking member comprises the first layer and the second layer and a third layer on the second layer.

11. A display apparatus comprising:
a substrate having a display area and a peripheral area around the display area;
a display device on the display area;
an encapsulating layer covering the display device, and comprising a first inorganic layer and a second inorganic layer on the first inorganic layer, the first inorganic layer on the display area and extending to a portion of the peripheral area;
a blocking member disposed on the peripheral area and comprising a first blocking member and a second blocking member; and
a conductive member disposed below the second blocking member,
wherein the first inorganic layer directly contacts the second inorganic layer in at least a region of the peripheral area,
wherein the first blocking member is disposed closer to the display area than the second blocking member, and
wherein a height of the second blocking member is higher than a height of the first blocking member.

\* \* \* \* \*